US008502526B2

(12) United States Patent
Nishikawa

(10) Patent No.: US 8,502,526 B2
(45) Date of Patent: Aug. 6, 2013

(54) MAGNETIC SENSOR CIRCUIT AND ELECTRONIC APPARATUS USING SAME

(75) Inventor: Hidetoshi Nishikawa, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 825 days.

(21) Appl. No.: 12/525,558

(22) PCT Filed: Jun. 20, 2008

(86) PCT No.: PCT/JP2008/061302
§ 371 (c)(1),
(2), (4) Date: Aug. 3, 2009

(87) PCT Pub. No.: WO2009/001762
PCT Pub. Date: Dec. 31, 2008

(65) Prior Publication Data
US 2010/0026281 A1    Feb. 4, 2010

(30) Foreign Application Priority Data

Jun. 22, 2007    (JP) ................................. 2007-165238

(51) Int. Cl.
  *G01B 7/14*    (2006.01)
  *G01B 7/30*    (2006.01)
  *G01R 33/07*   (2006.01)
(52) U.S. Cl.
  USPC ................. 324/207.2; 324/27.24; 324/207.25
(58) Field of Classification Search
  USPC .............................................. 324/207.2, 251
  See application file for complete search history.

(56) References Cited

U.S. PATENT DOCUMENTS

| 5,604,433 | A | 2/1997 | Theus et al. |
|---|---|---|---|
| 7,570,044 | B2 * | 8/2009 | Takeda ....................... 324/117 H |
| 7,750,628 | B2 * | 7/2010 | Rengachari ................... 324/252 |
| 2003/0020470 | A1 | 1/2003 | Hatanaka |
| 2003/0205996 | A1 | 11/2003 | Hara et al. |
| 2004/0130317 | A1 | 7/2004 | Hatanaka |
| 2008/0030191 | A1 * | 2/2008 | Nishikawa .................... 324/252 |
| 2008/0265880 | A1 | 10/2008 | Nishikawa |

FOREIGN PATENT DOCUMENTS

| CN | 1400471 A | 3/2003 |
|---|---|---|
| JP | 02-032278 | 2/1990 |
| JP | 08-201491 | 8/1996 |
| JP | 3315397 | 6/2002 |
| JP | 2003-043123 | 2/2003 |
| JP | 2004-180286 | 6/2004 |
| WO | WO 2006/085503 | 8/2006 |

* cited by examiner

*Primary Examiner* — Patrick Assouad
*Assistant Examiner* — David M. Schindler
(74) *Attorney, Agent, or Firm* — Fish & Richardson P.C.

(57) ABSTRACT

A magnetic sensor circuit of the present invention includes: a Hall device 10; selection switch circuit 20 switching a detection state of the Hall device 10 to either a first switch state or a second switch state; a comparator unit 60 performing comparison using a detection voltage of a magnetoelectric conversion device 10 aid a predetermined reference voltage to generate a comparison result signal COUT; a logic circuit 80 generating, based on an output signal OUT and the comparison result signal COUT, a logic operation signal LOUT for maintaining or inverting the logic of the output signal OUT; a latch circuit 70 latching the logic operation signal LOUT to output this as the output signal OUT; and a control circuit go determining, based on the output signal OUT, an order of switching the detection state of the Hall device 10 (from the first switch state to the second switch state, or from the second switch state to the first switch state).

7 Claims, 13 Drawing Sheets

| OUT | COUT | LOUT |
|---|---|---|
| L | L | L |
| L | H | H |
| H | L | H |
| H | H | L |

(a) IDEAL STATE (b) STATE WHERE COMPARISON OFFSET VOLTAGE IS PRESENT

MAGNETIC SENSOR CIRCUIT AND ELECTRONIC APPARATUS USING SAME

TECHNICAL FIELD

The present invention relates to an alternating magnetic field detection type magnetic sensor circuit that detects a magnet field of the site at which it is placed using a magnetoelectric conversion device (such as a Hall device and a magnetic resistive device), and generates an output signal having a logic corresponding to the polarity (S pole/N pole) of the magnetic field, and to electronic apparatuses using this (e.g., rotation detecting devices and brushless motor driver ICs having a rotation detecting function).

BACKGROUND ART

Magnetic sensor circuits typically include a Hall device that outputs an output voltage proportional to the intensity of a magnetic field, an amplifier that amplifies the output voltage of the Hall device, and a comparator that compares an output voltage of the amplifier with a predetermined reference voltage to output a comparison result, and the magnetic sensor circuit outputs a binary signal (which is either high level or low level at a time) according to whether or not the intensity of the magnetic field at the site in which the magnetic field sensor is placed is higher than a given standard.

To obtain an accurate comparison result that reflects the intensity of the magnetic field, it is necessary to reduce an offset signal component contained in the signal outputted from the amplifier to reduce the variation of this signal. Main factors that produce the offset signal component here are the offset signal component contained in the output voltage of the Hall device (hereinafter, "device offset voltage") and the offset signal component present at the input terminal of the amplifier (hereinafter, "input offset voltage"). The device offset voltage is generated chiefly by stress or the like that the Hall device proper receives from its package. On the other hand, the input offset voltage is generated chiefly by variations or the like in the characteristics of the devices that form the input stage of the amplifier.

A magnetic field sensor that is less affected by such offset voltages is disclosed in Patent Document 1 listed below. The magnetic field sensor incorporates a Hall device, which is, like the Hall device 1 shown in FIG. 14, typically formed as a plate having a shape that is geometrically equivalent with respect to four terminals A, C, B, and D. Here, a geometrically equivalent shape denotes one, like the shape of the Hall device 1 shown in FIG. 14, whose shape in one orientation is identical with its shape in a 90 degrees rotated orientation (rotated such that diagonal A-C now lies where diagonal BD lay before). In this Hall device 1, between the voltage that appears between terminals B and D when a power supply voltage is applied between terminals A and C and the voltage that appears between terminals A and C when the power supply voltage is applied between terminals B and D, effective signal components contained respectively in them—the components commensurate with the intensity of the magnetic field—are in-phase, whereas the device offset voltages contained respectively in them are in opposite phases.

First, in a first period, through a switch circuit 2, the supply voltage is applied between terminals A and C of the Hall device 1, and the voltage between terminals B and D is fed to a voltage amplifier 3. Thus, the voltage amplifier 3 outputs a voltage V1 proportional to the sum of the voltage between terminals B and D and the input offset voltage of the voltage amplifier 3. Moreover, in this first period, a switch 5 is closed, so that a capacitor 4 is charged up to the voltage V1.

Subsequently, in a second period, through the switch circuit 2, the supply voltage is applied between terminals B and D of the Hall device 1, and the voltage between terminals C and A is fed to the voltage amplifier 3 with the polarity opposite to that in the first period. Thus, the voltage amplifier 3 outputs a voltage V2 proportional to the sum of the voltage between terminals C and A and the input offset voltage of the voltage amplifier 3.

Here, irrespective of the polarity of the input voltage, the influence of the input offset voltage remains the same as in the first period. Accordingly, the voltage V2 from the voltage amplifier 3 is proportional to the sum of the voltage between terminals C and A—a voltage of the polarity opposite to that in the first period—and the input offset voltage.

Moreover, in this second period, the switch 5 is open, so that an inverting output terminal 3a and a non-inverting output terminal 3b of the voltage amplifier 3 and the capacitor 4 are connected in series between output terminals 6 and 7. Here, the charge voltage of the capacitor 4 remains unchanged from, and is thus held equal to, the output voltage V1 of the voltage amplifier 3 in the first period. The voltage V between the output terminals 6 and 7 (the output voltage of the magnetic field sensor) equals the sum of the voltage V2 at the non-inverting output terminal 3b of the voltage amplifier 3 relative to that at its inverting output terminal 3a and the voltage—V1 at one end 4a of the capacitor 4 relative to that at its other end 4b, that is, the voltage V2 minus the voltage V1. In this way, the influence of the input offset voltage is cancelled out, and thus the magnetic field sensor yields, as its output voltage, the voltage V free from it.

Also conventionally known is a magnetic field sensor that not only is less affected by the device offset voltage but also is less affected by the input offset voltage arising in the amplifier, as disclosed in Patent Document 2 listed below. This magnetic field sensor is composed of a Hall device, a switch circuit, a voltage-current converter-amplifier, a capacitor as a memory device, a switch, and a resistor.

As another example of conventional technologies related to the above description, a magnetic sensor circuit that not only is less affected by the device offset voltage but also is less affected by the input offset voltage arising in the amplifier is disclosed and proposed in Patent Document 3 listed below filed by the applicant of this application.

Patent Document 1: Japanese Patent Registered No. 3315397, Specification
Patent Document 2: JP-A-H08-201491
Patent Document 3: International Publication WO 2006/085503, Pamphlet

DISCLOSURE OF THE INVENTION

Problems to be Solved by the Invention

It is true that, with the above-described conventional technologies, it is possible to cancel out the device offset voltage and the input offset voltage to accurately measure the intensity of a magnetic field.

The above-described conventional technologies are related to switch-type magnetic sensor circuits (used mainly for detecting the location of a magnet) shifting the logic of an output signal according to the intensity of the detected magnetic field, but other types of magnetic sensor circuits different from switch-type magnetic sensor circuits are also known; one of them is an alternating magnetic field detection type magnetic sensor circuit (used mainly for detecting rotation)

shifting the logic of the output signal according to the polarity (S pole/N pole) of the detected magnetic field.

As shown in FIG. 15, this alternating magnetic field detection type magnetic sensor circuit is so configured as to determine a magnetic-field-detection level for alternating magnetic field detection by switching the polarity of a reference voltage VREF (difference between a first reference voltage Vref1 and a second reference voltage Vref2) that is applied between input terminals of a comparator 6 according to the logic value of an output signal OUT of the magnetic sensor circuit (and thus, according to whether an S-pole signal or an N-pole signal is to be subsequently detected), that is, so configured as to use the output signal OUT as a selection signal of a reference voltage generating circuit 5.

However, in the just-described conventional magnetic sensor circuit, an offset signal component present in the input stage of the comparator 6 (hereinafter, "comparator offset voltage") causes deviation corresponding thereto in the magnetic-field-detection level for detecting the S-pole signal and in the magnetic-field-detection level for detecting the N-pole signal.

More specifically, when a comparator offset voltage is present between a non-inverting input terminal (+) and an inverting input terminal (−) of the comparator 6, the magnetic-field-detection level for detecting the S-pole signal is reduced (or increased) by an amount corresponding to the comparator offset voltage, whereas the magnetic-field-detection level for detecting the N-pole signal is increased (or reduced) by the amount corresponding to the comparator offset voltage. That is, taking the difference between the two magnetic-field-detection levels into consideration, deviation corresponding to an amount twice as large as the comparator offset voltage occurs between the magnetic-field-detection levels of the alternating magnetic field detection.

As a result, in the just-described conventional magnetic sensor circuit, as shown in FIGS. 16(a) and 16(b), the S-pole and the N-pole magnetic field detection levels (denoted by Bop and Brp, respectively, in the figures) are deviated toward the S-pole side (or the N-pole side), which breaks symmetry between the S-pole and the N-pole magnetic field detection levels.

In rotation detection performed using the magnetic sensor circuit in which the symmetry between the S-pole and the N-pole magnetic field detection levels is broken as just described, the duty ratio of the output pulse does not have an ideal value (i.e., 50%), and this is quite inconvenient to the user. In particular, when the magnet force of the detected magnet is weak, the effect of the comparator offset voltage described above is larger, and thus it is very important to solve the problems described above.

In view of the above problems, an object of the present invention is to provide a magnetic sensor circuit capable of canceling out the effect of a comparator offset voltage to allow magnetic-field-detection levels of alternating magnetic field detection to be symmetric to each other, and an electronic apparatus using this.

Means for Solving the Problem

To achieve the above object, according to one aspect of the present invention, a magnetic sensor circuit generating an output signal having a logic corresponding to a polarity of a detected magnetic field includes: a magnetoelectric conversion device; a selection switch circuit switching a detection state of the magnetoelectric conversion device either to a first or a second switch state at one time; a comparator unit performing a predetermined comparison using a detection voltage of the magnetoelectric conversion device and a predetermined reference voltage to generate a comparison result signal corresponding to a result of the predetermined comparison; a logic circuit generating, based on the output signal and the comparison result signal, a logic operation signal for maintaining or inverting a logic of the output signal; a latch circuit latching the logic operation signal to output a latched logic operation signal as the output signal; and a control circuit determining, based on the output signal, whether switching control of the selection switch circuit is to be performed in an order from the first switch state to the second switch state or in an order from the second switch state to the first switch state (first configuration).

More specifically, according to another aspect of the present invention, a magnetic sensor circuit generating an output signal having a logic corresponding to a polarity of a detected magnetic field includes: a magnetoelectric conversion device generating, between a first pair of terminals or between a second pair of terminals, an output voltage commensurate with magnetism applied thereto; a selection switch circuit switched between a first switch state in which a power supply voltage is applied between the first pair of terminals and a voltage appearing between the second pair of terminals is outputted between a first output terminal and a second output terminal and a second switch state in which the power supply voltage is applied between the second pair of terminals and a voltage appearing between the first pair of terminals is outputted between the first output terminal and the second output terminal; an amplifier unit not only generating a first amplified voltage by amplifying a voltage applied from the first output terminal to output the first amplified voltage from a first amplification output terminal but also generating a second amplified voltage by amplifying a voltage applied from the second output terminal to output the second amplified voltage from a second amplification output terminal; a comparator unit performing comparison between a first comparison voltage fed to a first comparison input terminal and a second comparison voltage fed to a second comparison input terminal to generate a comparison result signal corresponding to a result of the comparison; a first capacitor provided between the first amplification output terminal and the first comparison input terminal; a second capacitor provided between the second amplification output terminal and the second comparison input terminal; a first switch circuit for applying a first reference voltage to the first comparison input terminal when the selection switch circuit is in the first switch state; a second switch circuit for applying a second reference voltage to the second comparison input terminal when the selection switch circuit is in the first switch state; a logic circuit generating a logic operation signal for maintaining or inverting a logic of the output signal based on the output signal and the comparison result signal; a latch circuit latching the logic operation signal to output, as the output signal, the logic operation signal thus latched; and a control circuit determining, based on the output signal, whether switching control of the selection switch circuit is to be performed in an order from the first switch state to the second switch state or in an order from the second switch state to the first switch state (second configuration).

According to the present invention, it is preferable that, in the magnetic sensor circuit having the second configuration, the control circuit intermittently supply power to at least one of the amplifier unit and the comparator unit (third configuration).

According to another aspect of the invention, an electronic apparatus includes: a target; the magnetic sensor circuit of any one of the first to the third configurations; and an analysis circuit analyzing movement of the target according to the output signal of the magnetic sensor circuit. Here, the target is provided with a magnet having a plurality of S-pole magnetized portions and a plurality of N-pole magnetized portions, and applies an alternating magnetic field to the magnetic sensor circuit as the target moves (fourth configuration).

According to the present invention, it is preferable that, in the electronic apparatus having the fourth configuration, the analysis circuit detect a position or a movement amount of the target by counting a number of pulses in an output signal obtained at the magnetic sensor circuit (fifth configuration).

According to the present invention, it is preferable that, in the electronic apparatus having the fourth or fifth configuration, a plurality of magnetic sensor circuits are provided as the magnetic sensor circuit along a direction in which the target moves, and that the analysis circuit detect a direction in which the target is moving by comparing output signals obtained at the plurality of magnetic sensor circuits among one another (sixth configuration).

Advantages of the Invention

According to the present invention, it is possible to cancel out the effect of the comparator offset voltage, and thus to allow the magnetic-field-detection levels of alternating magnetic field detection to be symmetric with each other.

LIST OF REFERENCE SYMBOLS

Figure 1:
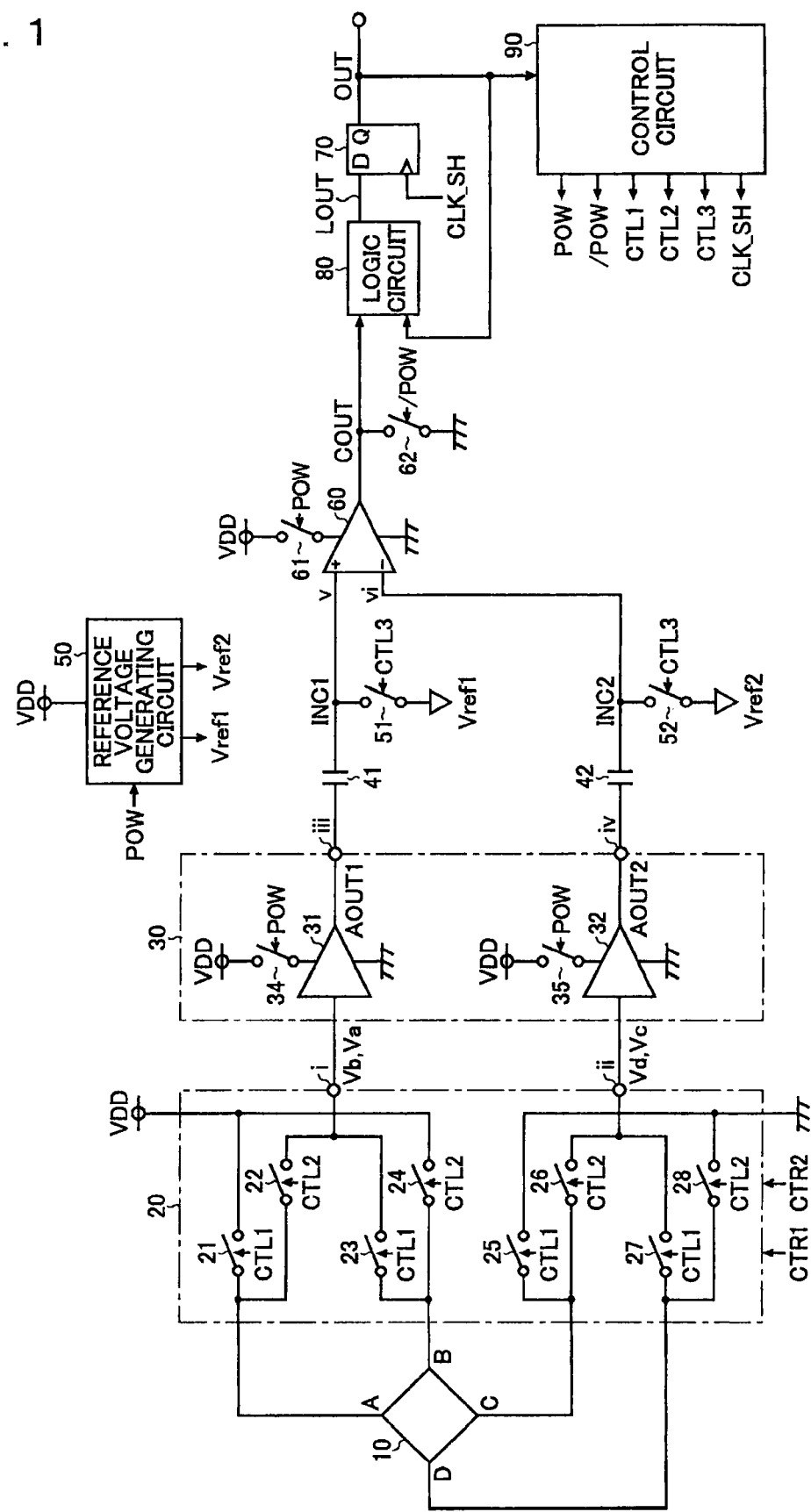
FIG. 1 is a diagram showing an embodiment of a magnetic sensor circuit of the present invention.

10 Hall device
20 selection switch circuit
21 to 28 switches
30, 30A, 30B amplifier units
31, 31A, 31B first amplifier circuits
32, 32A, 32B second amplifier circuits
33 feedback resistor
34, 35 switch circuits
40 capacitor
41, 42 first capacitor, second capacitor
50 reference voltage generating circuit
50-1 to 50-3 division resistors
50-4 P-type MOS transistor
50-5 N-type MOS transistor
50-6, 50-7 inverters
51, 52 first switch circuit, second switch circuit
60 comparator unit
61, 62 switch circuits
70 latch circuit
80 logic circuit
81, 82 inverters
83, 84 AND operation units
85 OR operation unit
90 control circuit
91 oscillator
92 start pulse signal generating circuit
93 shift register
94 OR operation unit
95, 96 inverters
97 switch signal generating circuit
97-1, 97-2, 97-3, 97-4 AND operation units
97-5, 97-6 OR operation units
VDD power supply voltage
Vref1, Vref2 first reference voltage, second reference voltage
POW power-on signal
/POW inverted power-on signal
CTL1, CTL2, CTL3 first switch signal, second switch signal, third switch signal
AOUT1, AOUT2 first amplified voltage, second amplified voltage
INC1, INC2 first comparison voltage, second comparison voltage
COUT comparison result signal
LOUT logic operation signal
OUT output signal
CLK_SH clock signal
OSC standard clock signal
SIG start pulse signal
S1, S2 first timing signal, second timing signal

BEST MODE FOR CARRYING OUT THE INVENTION

Hereinafter, a description will be given of embodiments of magnetic sensor circuits according to the present invention with reference to the accompanying drawings. Magnetic sensor circuits of the present invention find wide application as sensors for detecting the state of magnetism (the intensity of a magnetic field), such as sensors for detecting the folded and unfolded states of a clamshell-type mobile phone, sensors for detecting the rotation position of a motor, and sensors for detecting rotation operation of a dial. These magnetic sensor circuits incorporate a magnetic sensor device that varies its electric characteristic with the magnetic field applied thereto and that yields an output voltage that varies with the variation in the electric characteristic. Examples of such a magnetic sensor device include a magnetoelectric conversion device such as a Hall device and a magnetic resistive device. The embodiments presented below deal with magnetic sensor circuits employing a Hall device (a so-called Hall IC).

FIG. 1 is a diagram showing an embodiment of the magnetic sensor circuit of the present invention. In FIG. 1, a Hall device 10 is formed as a plate having a shape that is geometrically equivalent with respect to four terminals A, C, B, and D.

In this Hall device 10, between a Hall voltage that appears between a second pair of terminals (B and D) when the supply voltage Vcc is applied between a first pair of terminals (A and C) and a Hall voltage that appears between the first pair of terminals (C and A) when the supply voltage Vcc is applied between the second pair of terminals (B and D), the effective signal components contained respectively in them—the components commensurate with the intensity of the magnetic field applied to the Hall device 10—are in-phase, whereas device offset components (device offset voltages) contained respectively in them are in opposite phases.

A selection switch circuit 20 switches the way the power supply voltage Vcc is applied to the Hall device 10 and the way the Hall voltage is derived from the Hall device 10.

More specifically, the selection switch circuit 20 has switches 21, 23, 25, and 27 that are turned on/off according to the logic of a first switch signal CTL1 and switches 22, 24, 26, and 28 that are turned on/off according to the logic of a second switch signal CTL2. In this embodiment, the switches 21, 23, 25, and 27 are turned on when the first switch signal CTL1 is high level and turned off when the first switch signal CTL1 is low level. The switches 22, 24, 25, and 27 are turned on when the second switch signal CTL2 is high level and turned off when the second switch signal CTL2 is low level. However, this relation between the logic levels of the switch signals CTL1 and CTL2 and the turned on/off of the switches is just given as an example, and the switches may be turned on/off according to the logic levels opposite to those described above.

The first and second switch signals CTL1 and CTL2 are generated such that their logics do not coincide with each other; the first switch signal CTL1 is high level in the former half (or the latter half) of the period during which a power-on signal POW is high level (which corresponds to the sensing period of the magnetic sensor circuit), and the second switch signal CTL2 is high level in the latter half (or the former half) of the period. The power-on signal POW is generated intermittently such that, for example, it is high level for a predetermined period at a given cycle. However, this relation among the logic levels of the switch signals CTL1 and CTL2 and the power-on signal POW is just given as an example, and it may be opposite to that described above.

In the first switch state, that is, in the state in which the first switch signal CTL1 is high level and the second switch signal CTL2 is low level, the power supply voltage VDD is applied to terminal A, terminal C is connected to ground, and a Hall voltage commensurate with the intensity of the magnetic field appears between terminals B and D. Which of the voltages at terminals B and D is higher depends on the direction of the magnetic field applied. Here, it is assumed that the voltage Vb at terminal B is the lower and the voltage Vd at terminal D is the higher. It should be noted that, unless otherwise stated, any voltage mentioned in the course of the description denotes a potential relative to ground.

On the other hand, in a second switch state, that is, in the state in which the first switch signal CTL1 is low level and the second switch signal CTL2 is high level, the power supply voltage VDD is applied to terminal B, terminal D is connected to ground, and a Hall voltage commensurate with the intensity of a magnetic field appears between terminals C and A. Here, switch from the first switch state to the second switch state takes place instantaneously, and therefore it is assumed that, in the second switch state, the polarity (direction) of the magnetic field remains the same as in the first switch state, in which case the voltage appearing between terminals C and A is such that the voltage Vc at terminal C is the lower, and the voltage Va at terminal A is the higher.

Thus, the voltage at a first output terminal "i" of the selection switch circuit 20 equals the voltage Vb in the first switch state, and equals the voltage Va in the second switch state. On the other hand, the voltage at a second output terminal "ii" of the selection switch circuit 20 equals the voltage Vd in the first switch state, and equals the voltage Vc in the second switch state.

An amplifier unit 30 has a first amplifier circuit 31 connected to the first output terminal "i" of the selection switch circuit 20 and a second amplifier circuit 32 connected to the second output terminal "ii" of the selection switch circuit 20.

The first amplifier circuit 31 amplifies, at a predetermined amplification factor ?, the voltage (the voltage Vb or the voltage Va) fed from the first output terminal "i" to output the amplified voltage as a first amplified voltage AOUT1 from a first amplification output terminal "iii". Since an input offset voltage Voffa1 is present in the first amplifier circuit 31, predetermined amplification is performed in the first amplifier circuit 31 after this input offset voltage Voffa1 is added to the just-mentioned input voltage (the voltage Vb or Va).

The second amplifier circuit 32 amplifies, at a predetermined amplification factor ?, the voltage (the voltage Vd or the voltage Vc) fed from the second output terminal "ii" to output the amplified voltage as a second amplified voltage AOUT2 from a second amplification output terminal "iv". Since an input offset voltage Voffa2 is present in the second amplifier circuit 32, predetermined amplification is performed in the second amplifier circuit 32 after this input offset voltage Voffa2 is added to the just-mentioned input voltage (the voltage Vd or Vc).

The power supply voltage VDD is applied to the first and second amplifier circuits 31 and 32 in the amplifier unit 30 via switch circuits 34 and 35, respectively. The switch circuits 34 and 35 are turned on/off according to the logic of the power-on signal POW; in this embodiment, they are turned on when the power-on signal POW is high level, and turned off when the power-on signal POW is low level.

Thus, the amplifier unit 30 operates in response to a high-level shift of the power-on signal POW, that is, intermittently such that, for example, it is operated for a predetermined period at a predetermined cycle. When the first and second amplifier circuits 31 and 32 are of a current-driven type, it is preferable that the switch circuits 34 and 35 be each configured as a current source circuit having a switch function.

A first capacitor 41 is connected between the first amplification output terminal "iii" of the amplifier unit 30 and a first comparison input terminal "v" (a non-inverting input terminal (+)) of a comparator unit 60. A second capacitor 42 is connected between the second amplification output terminal "iv" of the amplifier unit 30 and a second comparison input terminal "vi" (an inverting input terminal (−)) of the comparator unit 60.

A reference voltage generating circuit 50 generates a first reference voltage Vref1 and a second reference voltage Vref2 that is higher than the first reference voltage Vref1 by a predetermined value VREF. The specific configuration of the reference voltage generating circuit 50 will be described later in detail.

In the comparator unit 60, the first comparison input terminal "v" receives the first reference voltage Vref1 via a first switch circuit 51, and the second comparison input terminal "vi" receives the second reference voltage Vref2 via a second switch circuit 52. The first and second switch circuits 51 and 52 are turned on/off according to the logic of a third switch signal CTL3; in this embodiment, they are turned on when the third switch signal CTL3 is high level and turned off when the third switch signal CTL3 is low level. However, this relation between the logic of the third switch signal CTL3 and the turning on/off of the first and second switch circuits 51 and 52 is given as an example, and the switch circuits may be turned on/off in the opposite way.

The comparator unit 60 compares a first comparison voltage INC1 fed to the first comparison input terminal "v" with a second comparison voltage INC2 fed to the second comparison input terminal "vi", sets the logic of the comparison result signal COUT high level when the first comparison voltage INC1 is higher than the second comparison voltage INC2, and sets the logic of the comparison result signal COUT to low level when the first comparison voltage INC1 is lower than the second comparison voltage INC2. The comparator unit 60 is configured to have extremely high input impedance. For example, its input stage is configured as a MOS transistor circuit. Thus, the magnetic sensor circuit of this embodiment, being provided with the comparator unit 60, is little affected by ripples or noise of the power supply voltage VDD, and this helps realize a stable sensing operation.

To the above-described comparator unit 60, the power supply voltage VDD is applied via a switch circuit 61. The switch circuit 61 is turned on/off according to the logic of the power-on signal POW; in this embodiment, it is turned on when the power-on signal POW is high level and turned off when the power-on signal POW is low level.

Thus, the comparator unit 60 operates in response to a high-level shift of the power-on signal POW (thus a low-level shift of an inverted power-on signal (/POW)), that is, intermittently such that, for example, it operates for a predetermined period at a predetermined cycle. When the comparator unit 60 is of a current-driven type, it is preferable that the switch circuit 61 be configured as a current source circuit having a switch function.

An output terminal of the comparator unit 60 is connected to a ground terminal via a switch circuit 62. The switch circuit 62 is turned on/off according to the logic of the inverted power-on signal (/POW); in this embodiment, it is turned on when the inverted power-on signal (/POW) is high level, and is turned off when the inverted power-on signal (/POW) is low level. As a result, when the power supply to the comparator unit 60 is cut off, the logic of the comparison result signal COUT is forcibly set to low level, and this helps prevent an unintended logic shift of a logic operation signal LOUT generated at a logic circuit 80 in the latter stage (and thus the output signal OUT).

A latch circuit 70 latches the logic operation signal LOUT obtained at the logic circuit 80 at edge timings of a clock signal CLK_SH to output this as the output signal OUT. The latch circuit 70 is preferably configured as a D-type flip-flop.

The logic circuit 80 generates the logic operation signal LOUT based on the comparison result signal COUT and the output signal OUT. The specific configuration and operation of the logic circuit 80 will be described later in detail.

A control circuit 90 not only generates the power-on signal POW, the inverted power-on signal (/POW), the clock signal CLK_SH, and the third switch signal CTL3 based on a standard clock signal OSC (not shown in FIG. 1) but also generates the first switch signal CTL1 and the second switch signal CTL2 on receiving the output signal OUT. The specific configuration and operation of the control circuit 90 will be described later in detail.

Figure 2:
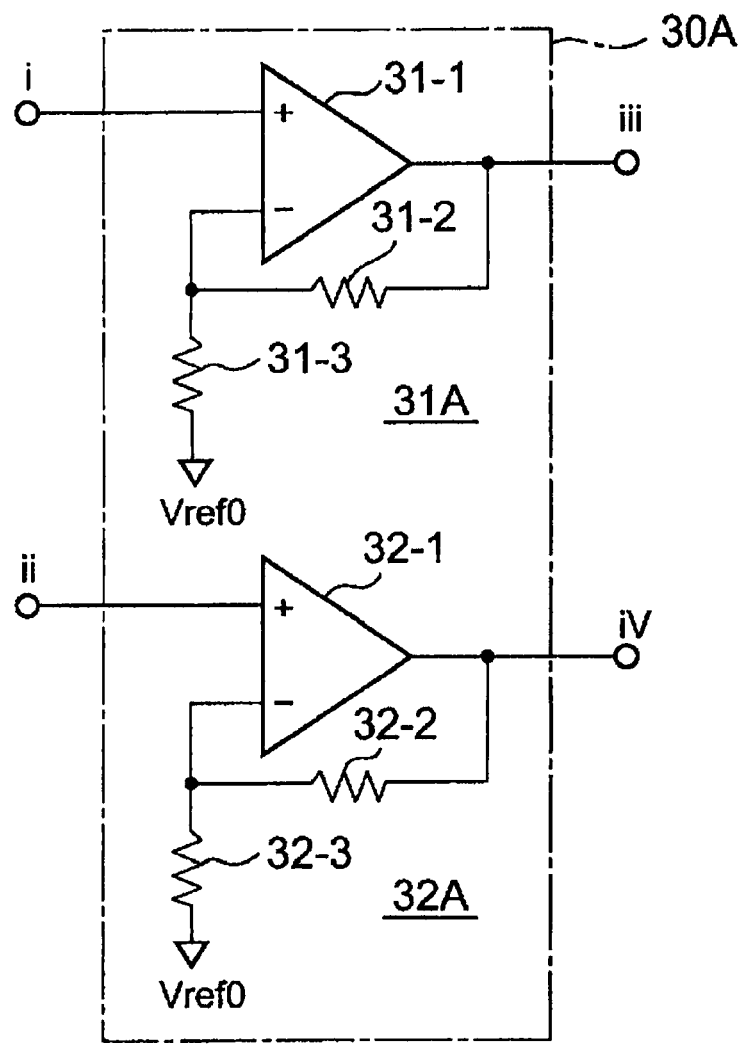
FIG. 2 is a diagram showing a first example of the configuration of an amplifier unit.

FIG. 2 is a diagram showing a first example of the configuration of an amplifier unit. The amplifier unit 30A shown in FIG. 2 has a first amplifier circuit 31A and a second amplifier circuit 32A.

In the first amplifier circuit 31A, a non-inverting input terminal (+) of an operational amplifier 31-1 is connected to the first output terminal "i" of the selection switch circuit 20. A feedback resistor 31-2 is connected between an inverting input terminal (−) and the first amplification output terminal "iii" of the operational amplifier 31-1. A feedback resistor 31-3 is connected between the inverting input terminal (−) of the operational amplifier 31-1 and a reference voltage Vrefo application terminal to which the reference voltage Vrefo is applied.

The first amplifier circuit 31A having the just-described configuration amplifies a voltage (the voltage Vb or the voltage Va) fed from the first output terminal "i" of the selection switch circuit 20 at the predetermined amplification factor α to output the amplified voltage as the first amplified voltage AOUT1 from the first amplification output terminal "iii".

On the other hand, at the second amplification circuit 32A, a non-inverting input terminal (+) of an operational amplifier 32-1 is connected to the second output terminal "ii" of the selection switch circuit 20. A feedback resistor 32-2 is connected between an inverting input terminal (−) of the operational amplifier 32-1 and the second amplification output terminal "iv". A feedback resistor 32-3 is connected between the inverting input terminal (−) of the operational amplifier 32-1 and the reference voltage Vrefo application terminal.

The second amplifier circuit 32A having the above configuration amplifies a voltage (the voltage Vd or the voltage Vc) fed from the second output terminal "ii" of the selection switch circuit 20 at the predetermined amplification factor α to output the amplified voltage as the second amplified voltage AOUT2 from the second amplification output terminal "iv".

In the amplifier unit 30A in FIG. 2, let the resistance of the feedback voltages 31-2 and 32-2 be R2 and let the resistance of the feedback resistors 31-3 and 32-3 be R1, then the amplification factor α is approximately equal to R2/R1, assuming that R2>>R1.

Figure 3:
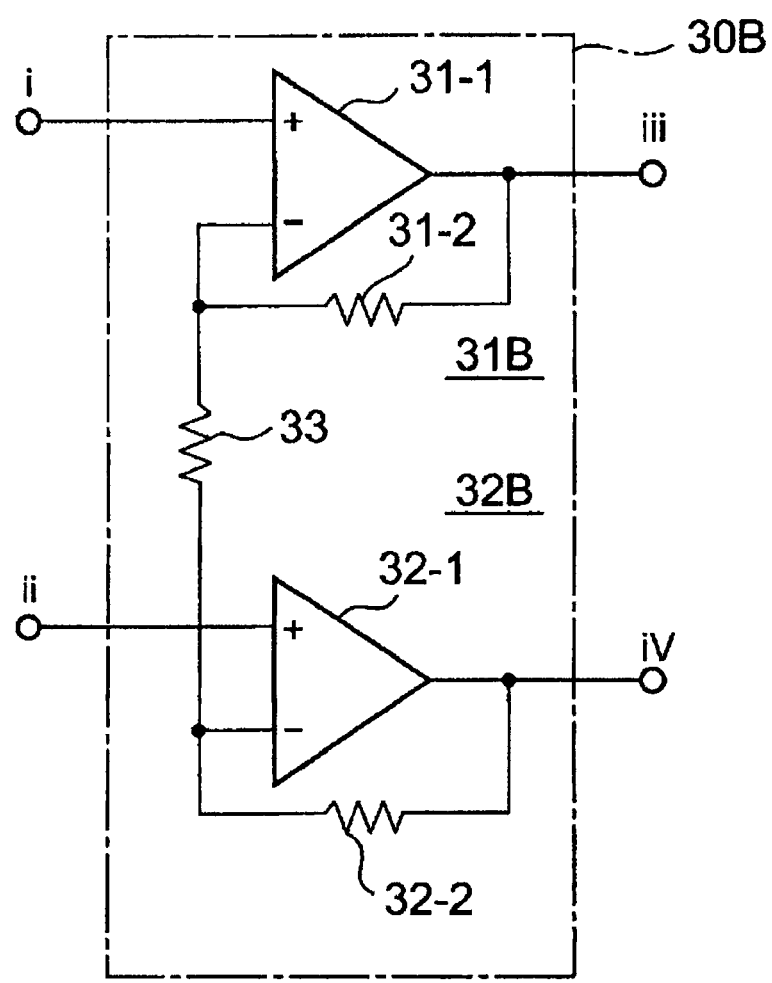
FIG. 3 is a diagram showing a second example of the configuration of the amplifier unit.

FIG. 3 is a diagram showing a second example of the configuration of an amplifier unit. An amplifier unit 30B in FIG. 3 has a first amplifier circuit 31B and a second amplifier circuit 32B.

In the first amplifier circuit 31B, a non-inverting input terminal (+) of an operational amplifier 31-1 is connected to the first output terminal "i" of the selection switch circuit 20. A first feedback resistor 31-2 is connected between an inverting input terminal (−) of the operational amplifier 31-i and the first amplification output terminal "iii".

On the other hand, in the second amplifier circuit 32B, a non-inverting input terminal (+) of an operational amplifier 32-1 is connected to the second output terminal "ii" of the selection switch circuit 20. A second feedback resistor 32-2 is connected between an inverting input terminal (−) of the operational amplifier 32-1 and the second amplification output terminal "iv".

A third feedback resistor 33 is connected between the inverting input terminal (−) of the first operational amplifier 31-1 and the inverting input terminal (−) of the second operational amplifier 32-1.

Thus, the amplifier unit 30B is configured such that the first amplifier circuit 31B and the second amplifier circuit 32B share the third feedback resistor 33; that is, it is configured as a balanced-input, balanced-output amplifier circuit. Compared with the amplifier unit 30A shown in FIG. 2, the amplifier unit 30B has the following advantages: it can be operated with less feedback resistors; and it requires no setting of reference voltages, because the reference voltages for the first and second amplifier circuits 31A and 31B are automatically set within the circuits.

Moreover, as a result of the amplifier unit 30B having a unique balanced-input, balanced-output configuration, it offers a high voltage amplification gain. Specifically, let resistance of the first and second feedback resistors 31-2 and 32-2 be R2, and let resistance of the third feedback resistor 33 be R1, then the amplification factor α approximately equals 2×R2/R1, assuming that R2>>R1. The doubled amplification factor α makes circuit design easy, and also makes it easy to handle a Hall device having low sensitivity. Although not clearly shown in FIGS. 2 and 3, in the amplifier units 30A and 30B, the amplification circuits preferably receive the power supply voltage VDD necessary for their operation through the switch circuits 34 and 35 as shown in FIG. 1.

Next, a description will be given of the configuration and operation of the reference voltage generating circuit 50 with reference to FIG. 4.

Figure 4:
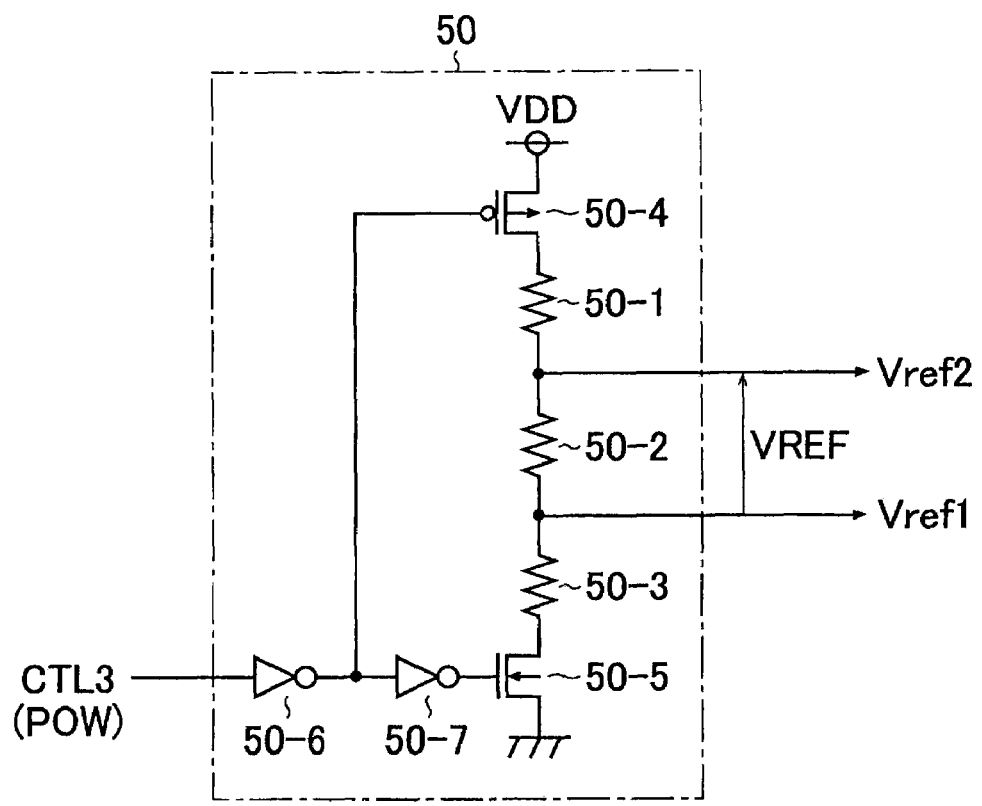
FIG. 4 is a diagram showing an example of the configuration of a reference voltage generating circuit 50.

FIG. 4 is a diagram showing an example of the configuration of the reference voltage generating circuit 50.

In the reference voltage generation circuit 50 shown in FIG. 4, the power supply voltage VDD is divided with division resistors 50-1 to 50-3 to generate the first reference voltage Vref1 and the second reference voltage Vref2. These reference voltages are generated when a P-type MOS transistor 50-4 connected to the power supply voltage VDD side of the division resistors 50-1 to 50-3 and an N-type MOS transistor 50-5 connected to the ground side of the division resistors 50-1 to 50-3 are on. These MOS transistors 50-4 and 50-5 are turned on/off, through inverters 50-6 and 50-7, according to the logic of the third switch signal CTL3. The MOS transistors 50-4 and 50-5 may be turned on/off according to, instead of the logic of the third switch signal CTL3, the logic of the power-on signal POW.

Next, a description will be given of the configuration and operation of the logic circuit 80 with reference to FIGS. 5 and 6.

Figures 5, 6:
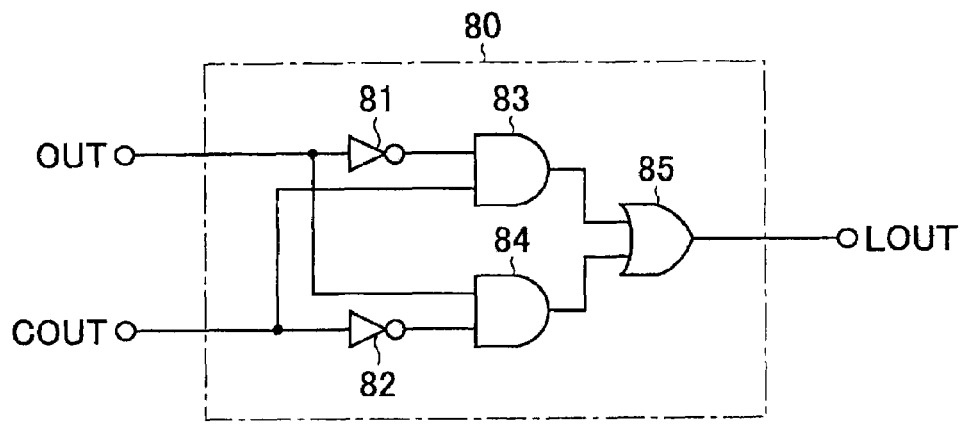
FIG. 5 is a diagram showing an example of the configuration of a logic circuit 80.
FIG. 6 is a logic table showing input/output logic levels of the logic circuit 80.

FIG. 5 is a diagram showing an example of the configuration of the logic circuit 80. FIG. 6 is a logic table showing input/output logic levels of the logic circuit 80.

As shown in FIG. 5, the logic circuit 80 has inverters 81 and 82, AND operation units 83 and 84, and an OR operation unit 85.

An input terminal of the inverter 8*i* is connected to an output signal OUT application terminal to which the output signal OUT is applied. An input terminal of the inverter 82 is connected to a comparison result output signal COUT application terminal to which the comparison result output signal COUT is applied. One input terminal of the AND operation unit 83 is connected to an output terminal of the inverter 81. The other input terminal of the AND operation unit 83 is connected to the comparison result signal COUT application terminal. One input terminal of the AND operation unit 84 is connected to the output signal OUT application terminal. The other input terminal of the AND operation unit 84 is connected to an output terminal of the inverter 82. One input terminal of the OR operation unit 85 is connected to an output terminal of the AND operation unit 83. The other input terminal of the OR operation unit 85 is connected to an output terminal of the AND operation unit 84. An output terminal of the OR operation unit 85 is connected, as a logic operation signal LOUT extraction terminal from which the logic operation signal LOUT is extracted, to a data input terminal (not shown in FIG. 5) of the latch circuit 70.

In the logic circuit 80 configured as just described, when the output signal OUT and the comparison result signal COUT are both low level, the logic operation signal LOUT is set to low level. When the output signal OUT is low level and the comparison result signal COUT is high level, the logic operation signal LOUT is set to high level. When the output signal OUT is high level and the comparison result signal COUT is low level, the logic operation signal LOUT is set to high level. When the output signal OUT and the comparison result signal COUT are both high level, the logic operation signal LOUT is set to low level.

Next, the configuration and operation of the control circuit go will be described in detail with reference to FIGS. 7 and 8.

Figure 7:
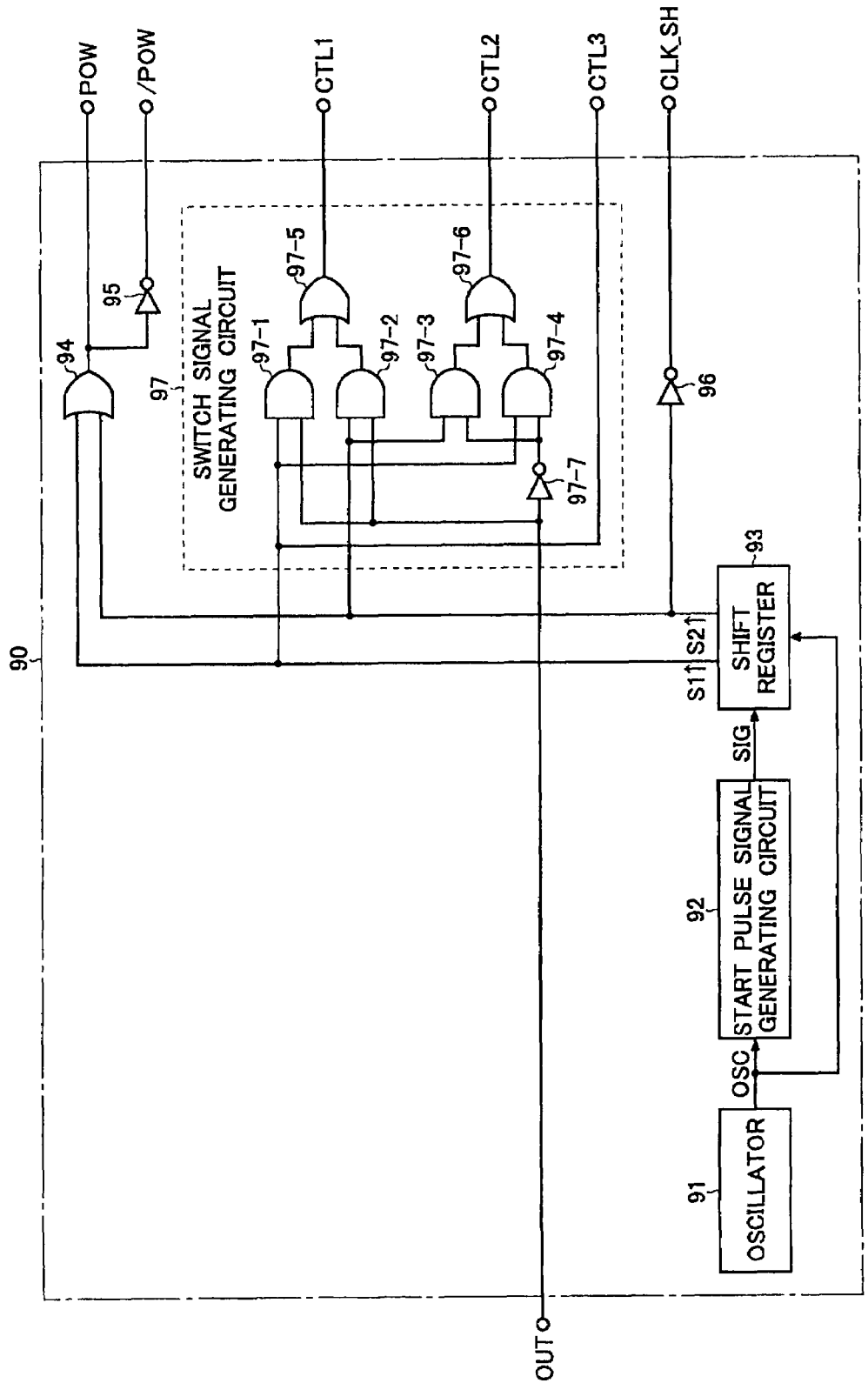
FIG. 7 is a diagram showing an example of the configuration of a control circuit 90.

FIG. 7 is a diagram showing an example of the configuration of the control circuit go. FIG. 8 is a timing chart for illustrating the operation of the magnetic sensor circuit of the present invention.

As shown in FIG. 7, the control circuit of this example includes an oscillator 91, a start pulse signal generating circuit 92, a shift register 93, an OR operation unit 94, inverters 95 and 96, and a switch signal generating circuit 97.

Figure 8:
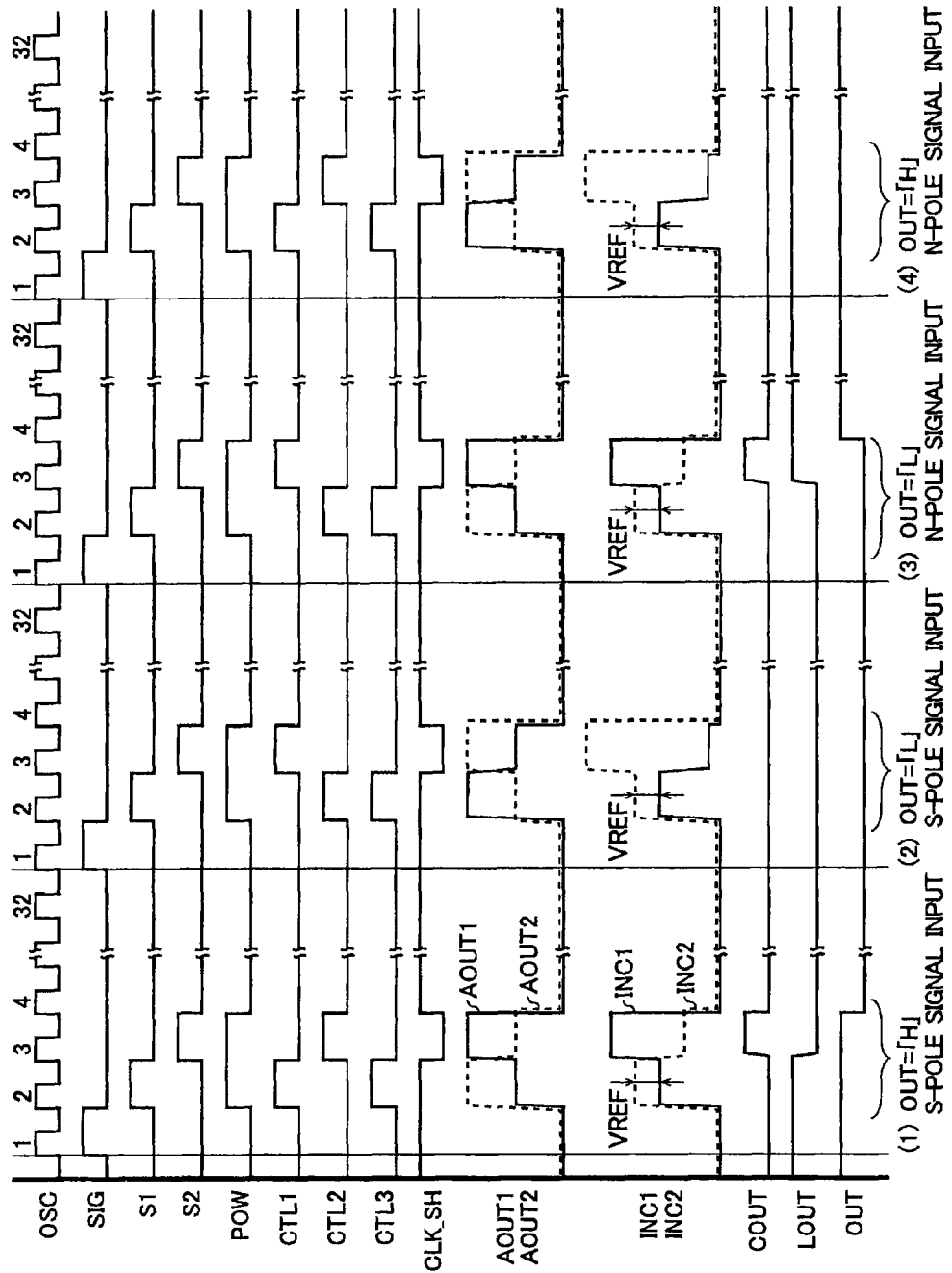
FIG. 8 is a timing chart for illustrating the operation of the magnetic sensor circuit of the present invention.

The oscillator 91 generates the standard clock signal OSC (see FIG. 8).

The start pulse generating circuit 92 generates a pulse every time the number of pulses in the standard clock signal OSC reaches a predetermined value (e.g., 32) to output this pulse as a start pulse signal SIG (see FIG. 8).

The shift register 93, on receiving the standard clock signal OSC and the start pulse signal SIG, sequentially takes in the start pulse signal SIG, shifting it at each pulse of the standard clock signal OSC, and outputs first stage register data and second stage register data as a first timing signal S1 and a second timing signal S2, respectively. That is, as shown in FIG. 8, when a pulse appears in the start pulse signal SIG, a pulse appears, in synchronization with the standard clock signal OSC, first in the first timing signal S1, and subsequently a pulse appears in the second timing signal S2.

The OR operation unit 94 performs an OR operation with respect to the first timing signal S1 and the second timing signal S2 to generate the power-on signal POW (see FIG. 8).

The inverter 95 generates the inverted power-on signal (/POW) (not shown in FIG. 8) by inverting the logic of the power-on signal POW.

The inverter 96 generates the clock signal CLK_SH (see FIG. 8) by inverting the logic of the second timing signal S2.

The switch signal generating circuit 97, on receiving the first and second timing signals S1 and S2 and the output signal OUT, generates the first switch signal CTL1, the second switch signal CTL2, and the third switch signal CTL3, and includes AND operation units 97-1 to 97-4, OR operation units 97-5 and 97-6, and an inverter 97-7.

One input terminal of the AND operation unit 97-1 is connected to a first timing signal S1 application terminal to which the first timing signal S1 is applied. The other input terminal of the AND operation unit 97-1 is connected to the output signal OUT application terminal. One input terminal of the AND operation unit 97-2 is connected to a second timing signal S2 application terminal to which the second timing signal S2 is applied. The other input terminal of the AND operation unit 97-2 is connected to the output signal OUT application terminal. One input terminal of the AND operation unit 97-3 is connected to the second timing signal S2 application terminal. The other input terminal of the AND operation unit 97-3 is connected to an output terminal of the inverter 97-7. One input terminal of the AND operation unit 97-4 is connected to the first timing signal S1 application terminal. The other input terminal of the AND operation unit 97-4 is connected to the output terminal of the inverter 97-7. One input terminal of the OR operation unit 97-5 is connected to an output terminal of the AND operation unit 97-1. The other input terminal of the OR operation unit 97-5 is connected to an output terminal of the AND operation unit 97-2. An output terminal of the OR operation unit 97-5 is connected, as a first switch signal CTL1 extraction terminal from which the first switch signal CTL1 is extracted, to the selection switch circuit 20 (not shown in FIG. 7). One input terminal of the OR operation unit 97-6 is connected to an output terminal of the AND operation unit 97-3. The other input terminal of the OR operation unit 97-6 is connected to an output terminal of the AND operation unit 97-4. An output terminal of the OR operation unit 97-6 is connected, as a second switch signal CTL2 extraction terminal from which the second switch signal CTL2 is extracted, to the selection switch circuit 20 (not shown in FIG. 7). An input terminal of the inverter 97-7 is connected to the output signal OUT application terminal.

The switch signal generating circuit 97 having the above structure outputs, as the first switch signal CTL1, an OR operation signal obtained at the OR operation unit 97-5, and also outputs, as the second switch signal CTL2, an OR operation signal obtained at the OR operation unit 97-6.

Thus, as shown in (1) and (4) in FIG. 8, when the output signal OUT is high level (that is, a state in which an N-pole signal has been detected and an S-pole signal should subsequently be detected), a pulse appears in the first switch signal CTL1 and then a pulse appears in the second switch signal CTL2 to amplify an S-pole signal. In other words, in the selection switch circuit 20, when the output signal OUT is high level, switching of the switches 21 to 28 is controlled such that the first switch state is first created and then the second switch state is created.

On the other hand, as shown in (2) and (3) in FIG. 8, when the output signal OUT is low level (that is, a state in which an S-pole signal has been detected and an N-pole signal should subsequently be detected), a pulse appears first in the second switch signal CTL2 and then a pulse appears in the first switch signal CTL1 to amplify an N-pole signal. In other words, in the selection switch circuit 20, when the output signal OUT is low level, switching of the switches 21 to 28 is controlled such that the second switch state is first created and then the first switch state is created.

The switch signal generating circuit 97 is so configured as to output, as the third switch signal CTL3, the first timing signal S1 as it is, and the first timing signal S1 application terminal is connected, as a third switch signal CTL3 extraction terminal from which the third switch signal CTL3 is extracted, to the first switch circuit 51 and the second switch circuit 52 (neither is shown in FIG. 7).

Next, a description will be given in detail of how the magnetic sensor circuit configured as described above operates, also with reference to the timing chart of FIG. 8.

First, the power-on signal POW is intermittently set to high level, and thus the power supply voltage VDD is intermittently supplied to units of the magnetic sensor circuit (specifically, main units such as the amplifier unit 30 and the comparator unit 60) to allow the magnetic sensor circuit to perform its detection operation. Combination of this intermittent power supply control and the latch control of the output signal OUT in a magnetic sensor circuit makes it possible to significantly reduce power consumption of electronic apparatuses (e.g., battery-powered mobile phones) incorporating this magnetic sensor circuit, without hampering the detection operation of the magnetic sensor circuit. The cycle at which the power-on signal POW is set to high level and the length of the high-level period of the power-on signal POW may be appropriately set according to what use the magnetic sensor circuit is applied to. The magnetic sensor circuit may be configured to operate continuously instead of intermittently.

Now, as shown in (1) and (4) in FIG. 8, when the output signal OUT is high level (that is, a state in which an N-pole signal has been detected and an S-pole signal should subsequently be detected), the first switch signal CTL1 and the third switch signal CTL3 are set to high level in synchronization with a rising edge of the standard clock signal OSC. The first switch signal CTL1 is set to high level to achieve the first switch state of the selection switch circuit 20, and as a result of the third switch signal CTL3 being set to high level, the first switch circuit 51 and the second switch circuit 52 are turned on.

As a result of the selection switch circuit 20 having been brought into the first switch state in response to the high-level shift of the first switch signal CTL1, the power supply voltage VDD is applied to terminal A and the ground voltage is applied to terminal C, terminals A and C being a first terminal pair of the Hall device 10, and a Hall voltage appears at each of terminals B and D, which are a second terminal pair of the Hall device 10. Here, the voltage Vb appears at terminal B, and the voltage Vd appears at terminal D.

At a first amplification output terminal "iii" of the amplifier unit 30 appears the first amplified voltage AOUT1 ($=\alpha(Vb-Voffa1)$) generated by amplifying the voltage Vb, and at a second amplification output terminal "iv" appears a second amplified voltage AOUT2 ($=\alpha(Vd-Voffa2)$) that is generated by amplifying the voltage Vd. Here, "a" denotes the amplification factor of the amplifier unit 30, "Voffa1" denotes the input offset voltage of the first amplifier circuit 31, and "Voffa2" denotes the input offset voltage of the second amplifier circuit 32.

On the other hand, as a result of the first switch circuit 51 and the second switch circuit 52 being both turned on in response to the high-level shift of the third switch signal CTL3, a state is created in which the first reference voltage Vref1 is applied to the first comparison input terminal "v" of the comparator unit 60 and the second reference voltage Vref2 is applied to the second comparison input terminal "vi" of the comparator unit 60.

As a result, the first capacitor 411 charged to the difference voltage between the first reference voltage Vref1 and the first amplified voltage AOUT1 (Vref1−α(Vb−Voffa1)). On the other hand, the second capacitor 42 is charged to the difference voltage between the second reference voltage Vref2 and second amplified voltage AOUT2 (Vref2−α(Vd−Voffa2)).

After these charging operations, in synchronization with the coming rising edge of the standard clock signal OSC, the first switch signal CTL1 and the third switch signal CTL3 are set to low level, and the second switch signal CTL2 is set to high level. As a result of the second switch signal CTL2 having been set to high level, the selection switch circuit 20 is brought into the second switch state. Also, as a result of the third switch signal CTL3 being set to low level, the first switch circuit 51 and the second switch circuit 52 are both turned off.

As a result of the selection switch circuit 20 having been brought into the second switch state in response to the high-level shift of the second switch signal CTL2, the power supply voltage VDD is applied to terminal B and the ground voltage is applied to terminal D, terminals B and D being the second terminal pair of the Hall device 10, and a Hall voltage appears at each of terminals C and A, which are the first terminal pair of the Hall device 10. Here, the voltage Vc appears at terminal C and the voltage Va appears at terminal A.

At the first amplification output terminal "iii" appears the first amplified voltage AOUT1 (=α(Va−Voffa1)) generated by amplifying the voltage Va, and at the second amplification output terminal "iv" appears the second amplified voltage AOUT2 (=α(Vc−Voffa2)) generated by amplifying the voltage Vc.

On the other hand, the first switch circuit 51 and the second switch circuit 52 are both turned off in response to the low-level shift of the third switch signal CTL3; however, the charges in the first capacitor 41 and the second capacitor 42 are held without any change, and thus the first comparison voltage INC1 at the first comparison input terminal "v" of the comparator unit 60 and the second comparison voltage INC2 at the second comparison input terminal "vi" of the comparator unit 60 are given by the following formulas (1) and (2), respectively.

$$INC1 = Vref1 - [\alpha(Vb - Voffa1) - \alpha(Va - Voffa1)] \quad (1)$$
$$= Vref1 - \alpha(Vb - Va)$$

$$INC2 = Vref2 - [\alpha(Vd - Voffa2) - \alpha(Vc - Voffa2)] \quad (2)$$
$$= Vref2 - \alpha(Vd - Vc)$$

As is clear from formulas (1) and (2), the first and second comparison voltages INC1 and INC2 do not contain the input offset voltage Voffa1 nor the input offset voltage Voffa2. That is, the input offset voltages Voffa1 and Voffa2 are cancelled out through the operations in the first and second switch states.

In the comparison unit 60, the first comparison voltage INC1 is compared with the second comparison voltage INC2. Here, as shown in (1) of FIG. 8, when an S-pole signal is fed to the magnetic sensor circuit and the first comparison voltage INC1 is higher than the second comparison voltage INC2, the comparison result signal COUT is set to high level. On the other hand, as shown in (4) of FIG. 8, when an N-pole signal is fed to the magnetic sensor circuit and the first comparison voltage INC1 is lower than the second comparison voltage INC2, the comparison result signal COUT is maintained low level. Here, the difference voltage between the first and the second comparison voltages INC1 and INC2 that is the target of comparison at the comparator unit 60 is given by the following formula (3).

$$INC1-INC2=Vref1-Vref2-\alpha(Vb-Va)+\alpha(Vd-Vc) \quad (3)$$

The Hall voltage generated by the Hall device 10 contains a signal component voltage, which is proportional to the intensity of the magnetic field, and a device offset voltage. In the Hall device 10, between the voltage appearing between terminals B and D in the first switch state and the voltage appearing between terminals C and A in the second switch state, the effective signal components contained respectively in them—the components commensurate with the intensity of the magnetic field—are in phase, whereas the device offset voltages contained respectively in them are in opposite phases.

Let the device offset voltages contained in the voltages Vb, Vd, Va, and Vc be Vboffe, Vdoffe, Vaoffe, and Vcoffe, respectively, and then the following relational formula holds: Vboffe−Vdoffe=Vaoffe−Vcoffe. Rearranging this formula gives the following formula (4).

$$Vboffe-Vaoffe=Vdoffe-Vcoffe \quad (4)$$

Formula (4) shows that the comparison between the first and second comparison voltages INC1 and INC2 according to the above-described formula (3) cancels out the device offset voltages.

In this way, the device offset voltages in the Hall device 10 and the input offset voltages in the amplifier unit 30 are all cancelled out through the comparison by the comparator unit 60.

The operation circuit 80 generates the logic operation signal LOUT based on the comparison result signal COUT obtained above and the output signal OUT that is being currently outputted.

More specifically, as shown in (1) of FIG. 8, when the comparison result signal COUT is shifted to high level while the output signal OUT is high level, it is judged that an S-pole signal has been detected, and the logic operation signal LOUT is shifted to low level to invert the logic of the output signal OUT. On the other hand, as shown in (4) of FIG. 8, when the comparison result signal COUT is maintained low level while the output signal OUT is high level, it is judged that no S-pole signal has been detected, and the logic operation signal LOUT is maintained high level to maintain the current logic level of the output signal OUT as it is.

The latch circuit 70 latches, in synchronization with a rising edge of the clock signal CLK_SH, the logic operation signal LOUT generated at the logic circuit 80 to output this as the output signal OUT. Thus, in (1) of FIG. 8, the output signal is switched from high level to low level, and in (4) of FIG. 8, the output signal OUT is maintained high level.

On the other hand, when the output signal OUT is low level (that is, the state in which an S-pole signal has been detected and an N-pole signal should subsequently be detected) as shown in (2) and (3) of FIG. 8, the second switch signal CTL2 and the third switch signal CTL3 are set to high level first, in synchronization with a rising edge of the standard clock signal OSC. As a result of the second switch signal CTL2 having been set to high level, the selection switch circuit 20 is brought into the second switch state. As a result of the third switch signal CTL3 having been set to high level, the first and second switch circuits 51 and 52 are turned on.

As a result of the selection switch circuit 20 having been brought into the second switch state in response to the high-level shift of the second switch signal CTL2, the power supply voltage and the ground voltage are applied to terminals B and D of the Hall device 10, respectively, terminals B and D being the second terminal pair, and a Hall voltage appears at each of terminals C and A, which are the first terminal pair of the Hall device 10. Here, the voltage Vc appears at terminal C and the voltage Va appears at terminal C.

At the first amplification output terminal "iii" of the amplifier unit 30 appears the first amplified voltage AOUT1 (=α(Va−Voffa1)) generated by amplifying the voltage Va, and at the second amplification output terminal "iv" appears the second amplified voltage AOUT2 (=α(Vc−Voffa2)) generated by amplifying the voltage Vc.

On the other hand, as a result of both the first switch circuit 51 and the second switch circuit 52 having been turned on in response to the high-level shift of the third switch signal CTL3, the first reference voltage Vref1 is applied to the first comparison input terminal "V" of the comparator unit 60 and the second reference voltage Vref2 is applied to the second comparison input terminal "vi".

In this way, the first capacitor 41 is charged to the difference voltage between the first reference voltage Vref1 and the first amplified voltage AOUT1 (Vref1−α(Va−Voffa1)). On the other hand, the second capacitor 42 is charged to the difference voltage between the second reference voltage Vref2 and the second amplified voltage AOUT2 (Vref2−α(Vc−Voffa2)).

After these charging operations, the second switch signal CTL2 and the third switch signal CTL3 are set to low level and the first switch signal CTL1 is set to high level in synchronization with the coming rising edge of the standard clock signal OSC. As a result of the first switch signal CTL1 having been set to high level, the selection switch circuit 20 is brought into the first switch state. As a result of the third switch signal CTL3 having been set to low level, the first switch circuit 51 and the second switch circuit 52 are both turned off.

As a result of the selection switch circuit 20 having been brought into the first switch state in response to the high-level shift of the first switch signal CTL1, the power supply voltage VDD and the ground voltage are applied to terminals A and C, respectively, terminals A and C being the first terminal pair of the Hall device 10, and a Hall voltage appear at each of terminals B and D, which are the second terminal pair of the Hall device 10. Here, the voltage Vb appears at terminal B and the voltage Vd appears at terminal D.

At the first amplification output terminal "iii" of the amplifier unit 30 appears the first amplified voltage AOUT1 (=α(Vb−Voffa1)) generated by amplifying the voltage Vb, and at the second amplification output terminal "iv" appears the second amplified voltage AOUT2 (=α(Vd−Voffa2)) generated by amplifying the voltage Vd.

On the other hand, although the first switch circuit 51 and the second switch circuit 52 are both turned off in response to the low-level shift of the third switch signal CTL3, the charges in the first capacitor 41 and the second capacitor 42 are held without any change, and thus the first comparison voltage INC1 at the first comparison input terminal "v" of the comparator unit 60 and the second comparison voltage INC2 at the second comparison input terminal "vi" of the comparator unit 60 are given by the following formulas (5) and (6), respectively.

$$INC1 = Vref1 - [\alpha(Va - Voffa1) - \alpha(Vb - Voffa1)] \quad (5)$$
$$= Vref1 - \alpha(Va - Vb)$$

$$INC2 = Vref2 - [\alpha(Vc - Voffa2) - \alpha(Vd - Voffa2)] \quad (6)$$
$$= Vref2 - \alpha(Vc - Vd)$$

As is clear from the above formulas (5) and (6), the first and second comparison voltages INC1 and INC2 do not contain the input offset voltage Voffa1 nor the input offset voltage Voffa2. That is, the input offset voltages Voffa1 and Voffa2 are cancelled out though the operations in the second switch state and the first switch state.

And, at the comparator unit 60, the first comparison voltage INC1 is compared with the second comparison voltage INC2. Here, as shown in (3) of FIG. 8, when an N-pole signal is fed to the magnetic sensor circuit and the first comparison voltage INC1 is higher than the second comparison voltage INC2, the comparison result signal COUT is set to high level. On the other hand, as shown in (2) of FIG. 8, when an S-pole signal is fed to the magnetic sensor circuit and the first comparison voltage INC1 is lower than the second comparison voltage INC2, the comparison result signal COUT is maintained low level. The difference voltage between the first and second comparison voltages INC1 and INC2 that are the targets of comparison at the comparison unit 60 is given by the following formula (7).

$$INC1-INC2=Vref1-Vref2-\alpha(Va-Vb)+\alpha(Vc-Vd) \quad (7)$$

Here, as already mentioned, a Hall voltage generated at the Hall device contains a signal component voltage, which is proportional to the intensity of the magnetic field, and a device offset voltage. In the Hall device 10, between the voltage that appears between terminals B and D in the first switch state and the voltage that appears between terminals C and A in the second switch state, the effective signal components contained respectively in them—the components commensurate with the intensity of the magnetic field—are in-phase, whereas the device offset voltages contained respectively in them are in opposite phases.

Also, as already mentioned, let the device offset voltages contained in the voltages Vb, Vd, Va, and Vc be Vboffe, Vdoffe, Vaoffe, and Vcoffe, respectively, and then the following relational formula holds: Vboffe−Vdoffe=Vaoffe−Vcoffe. Rearranging this relational formula gives the following formula (8).

$$Vaoffe-Vboffe=Vcoffe-Vdoffe \quad (8)$$

Formula (8) shows that the comparison between the first and second comparison voltages INC1 and INC2 according to formula (7) cancels out the device offset voltages.

In this way, the device offset voltages in the Hall device 10 and the input offset voltages in the amplifier unit 30 are all cancelled out through the comparison performed by the comparator unit 60.

The operation circuit 80 generates the logic operation signal LOUT based on the comparison result signal COUT obtained as described above and the currently outputted output signal OUT.

More specifically, as shown in (3) of FIG. 8, when the comparison result signal COUT is shifted to high level while the output signal OUT is low level, it is judged that an N-pole signal has been detected, and the logic operation signal LOUT is shifted to high level to invert the logic of the output signal OUT. On the other hand, as shown in (2) of FIG. 8, when the comparison result signal COUT is maintained low level while the output signal OUT is low level, it is judged that no N-pole signal has been detected, and the logic operation signal LOUT is maintained low level to maintain the current logic level of the output signal OUT.

The latch circuit 70 latches, in synchronization with a rising edge of the clock signal CLK_SH, the logic operation signal LOUT generated at the logic circuit 80 to output this as the output signal OUT. Thus, in (3) of FIG. 8, the output signal is switched from low level to high level, and in (2) of FIG. 8, the output signal OUT is maintained low level.

A general description will be given of the alternating magnetic field detecting operation (the output signal OUT generating operation) with reference to the flow chart of FIG. 9.

Figure 9:
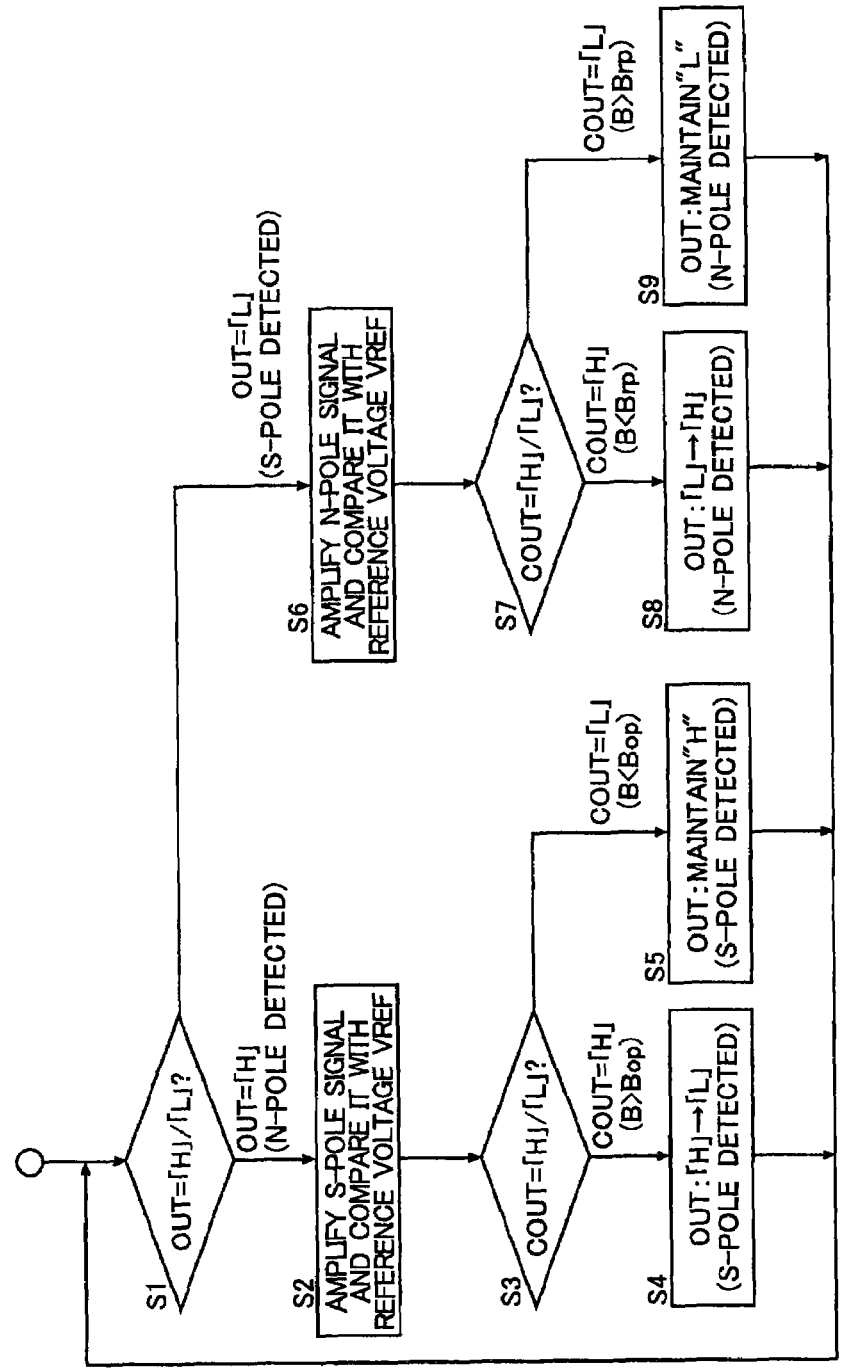
FIG. 9 is a flow chart for illustrating the operation of the magnetic sensor circuit of the present invention.

FIG. 9 is a flow chart for illustrating how the magnetic sensor circuit of the present invention operates.

In detecting an alternating magnetic field, in step S1, it is checked whether the output signal OUT is high level or low level. When the output signal is found to be high level, the flow is advanced to step S2. On the other hand, if the output signal OUT is found to be low level, the flow is advanced to step S6.

When the output signal OUT is found to be high level in step S1, then in step S2, under the recognition that the present state is such that an N-pole signal has been detected and an S-pole signal should subsequently be detected, switching control of the selection switch circuit 20 is performed in an order from the first switch state to the second switch state to amplify an S-pole signal, and the first and second comparison signals INC1 and INC2 obtained thereby are subjected to comparison (comparison between the difference voltage between them and a reference voltage VREF).

In the following step S3, it is checked whether the comparison result signal COUT is high level or low level. Here, when the comparison result signal COUT is found to be high level (applied magnetic field B>detected S-pole magnetic field level Bop), the flow is advanced to step S4. On the other hand, when the comparison result signal is found to be low level (applied magnetic field B<detected S-pole magnetic field level Bop), the flow is advanced to step S5.

When the comparison result signal COUT is found to be high level in step S3, then in step S4, under the recognition that an S-pole signal has been detected, the output signal OUT is shifted from high level to low level. Thereafter, the flow is returned to step S1.

On the other hand, when the comparison output result signal COUT is found to be low level in step S3, then in step 5, under the recognition that the present state is such that no S-pole signal has been detected, the output signal OUT is maintained high level. Thereafter, the flow is returned to step S1.

When the output signal OUT is found to be low level in step S1, then in step S6, under the recognition that the present state is such that an S-pole signal has been detected and an N-pole signal should subsequently be detected, the switching control of the selection switch circuit 20 is performed in the order from the second switch state to the first switch state to amplify an N-pole signal, and the first and second comparison signals INC1 and INC2 obtained thereby are subjected to comparison (comparison between the difference voltage between them and the reference voltage VREF).

In the following step S7, it is checked whether the comparison result signal COUT is high level or low level. Here, when the comparison result signal COUT is found to be high level (applied magnetic field B<detected N-pole magnetic field level Brp), the flow is advanced to step S8. On the other hand, when the comparison output signal is found to be low level (applied magnetic field B>detected N-pole magnetic field level Brp), the flow is advanced to step S9.

When the comparison result signal COUT is found to be high level in Step S7, then in step S8, under the recognition that an N-pole signal has been detected, the output signal OUT is shifted from low level to high level. Thereafter, the flow is returned to step S1.

On the other hand, when the comparison result signal COUT is found to be low level in step S7, then in step S9, under the recognition that no N-pole signal has been detected, the output signal OUT is maintained low level. Thereafter, the flow is returned to step S1.

As described above, the magnetic sensor circuit of the present invention is one that generates the output signal OUT corresponding to the polarity (S pole/N pole) of a detected magnetic field, and includes: the Hall device 10, the selection switch circuit 20 switching the detection state of the Hall device 10 to either the first switch state or the second switch state at a time; the comparator unit 60 performing predetermined comparison using a detection voltage of the Hall device 10 and a predetermined reference voltage to generate the comparison result signal COUT corresponding to the result of the predetermined comparison; the logic circuit 80 generating, based on the output signal OUT and the comparison result signal COUT, the logic operation signal LOUT for maintaining or inverting the logic of the output signal OUT; the latch circuit 70 latching the logic operation signal LOUT to output this as the output signal OUT; and the control circuit go determining whether the switching control of the selection switch circuit 20 should be performed in the order from the first switch state to the second switch state or in the order from the second switch state to the first switch state.

Thus, with the configuration where the polarity of the reference voltage VREF applied between the input terminals of the comparator unit 60 is maintained constant whether an S-pole signal is detected or an N-pole signal is detected and where it is set whether to amplify an S-pole signal or an N-pole signal by determining, according to the output signal OUT, the order in which the first and second switch states are achieved, even in the case where a comparator offset voltage is present between a non-inverting input terminal (+) and an inverting input terminal (−) of the comparator unit 60, the magnetic-field-detection level for detecting an S-pole signal and that for detecting an N-pole signal vary by the same amount commensurate with the comparator offset voltage, showing the same tendency. That is, in terms of the relative difference between the levels, the effect of the comparator offset voltage is cancelled out and the magnetic-field-detection levels of alternating magnetic field detection are maintained symmetric.

Thus, according to the present invention, since the duty ratio of a pulse that appears in the output signal OUT can be the ideal value (50%), a user-friendly magnetic sensor circuit can be provided.

Also, according to the present invention, an alternating magnetic field detection type magnetic sensor circuit can be realized on the basis of a conventional switch-type magnetic sensor, by modifying only the logic sections (such as the logic circuit and the control circuit) of the circuit configuration thereof, and this helps reduce development-related costs.

Also, according to the present invention, there is no need of providing a switch for switching the polarity of the reference voltage VREF.

Next, a description will be given in detail of a first application example of the magnetic sensor circuit of the present invention with reference to FIG. 10.

Figure 10:
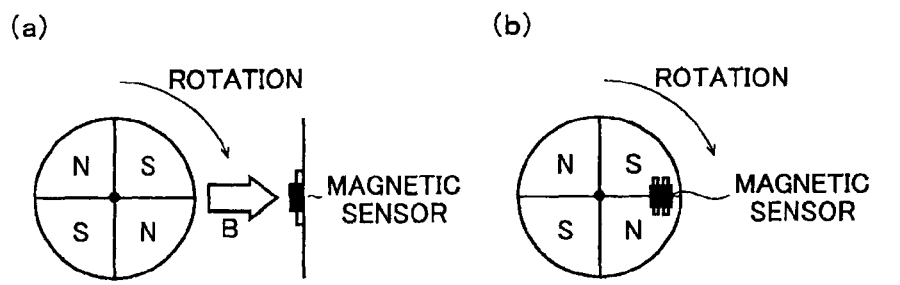
FIG. 10 is a set of diagrams showing a first example of the application of the magnetic sensor circuit of the present invention.
Figure 10:
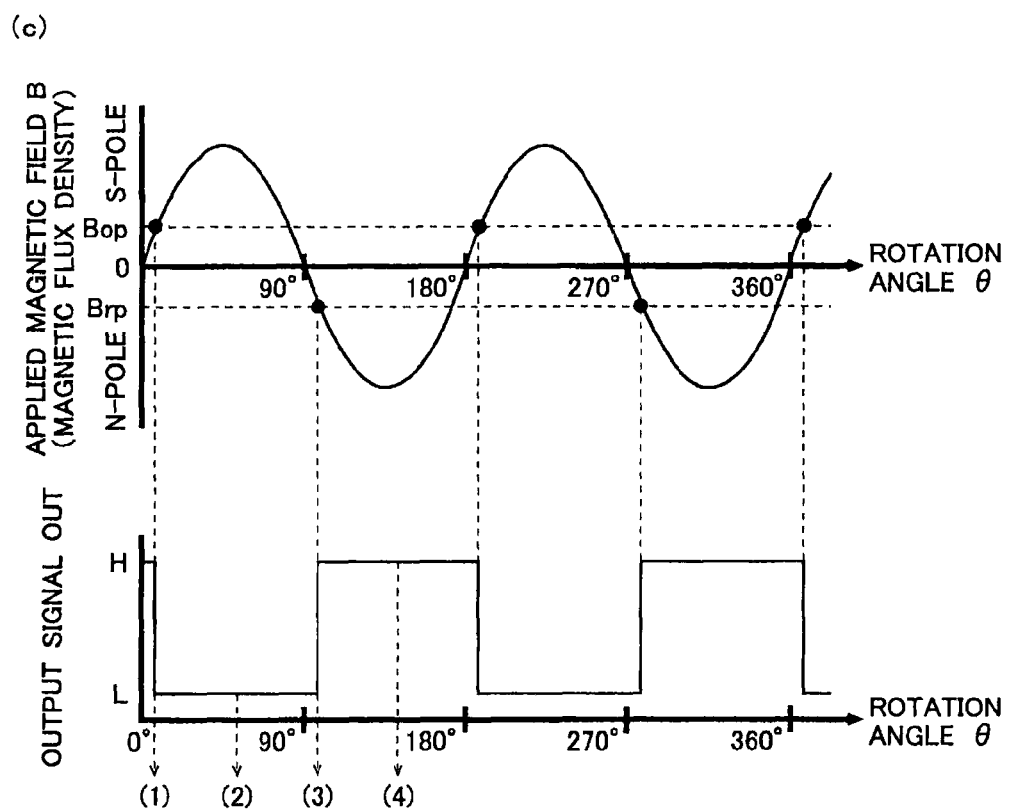

FIG. 10 is a set of diagrams showing a first application example of the magnetic sensor circuit of the present invention (application thereof in rotation detection). FIGS. 10(*a*) and 10(*b*) are diagrams conceptually showing application of the magnetic sensor circuit of the present invention in rotation detection, and FIG. 10(*c*) is a timing chart for showing the relationship between the applied magnetic field B (magnetic flux density) and the output signal OUT with respect to a rotation angle θ. (1) to (4) in FIG. 10(*c*) correspond to (i) to (4) in FIG. 8, which has already been referred to.

As shown in FIGS. 10(*a*) and 10(*b*), a target whose rotation is to be detected is provided with a magnet having a plurality of S-pole and N-pole magnetized portions, and is so formed as to apply an alternating magnetic field to the magnetic sensor circuit as it rotates. The magnetic sensor circuit may be placed on a side-face side of the target (magnet) as shown in FIG. 10(*a*) or may be placed on a top-face or bottom-face side of the target (magnet) as shown in FIG. 10(*b*).

Thus, as shown in FIG. 10(*c*), the output signal OUT of the magnetic sensor circuit varies in a pulse-like manner as the target rotates, and thus the number of pulses in the output signal OUT is commensurate with the number of rotation of the target (the number of switching between the S pole and the N pole). Hence, by counting the number of pulses in the output signal OUT using an analysis circuit, the number of rotation and the rotation angle of the target can be detected. Examples of possible application include tachometers and steering angle detectors.

Accuracy of detection of the target rotation angle can be improved by dividing the magnet into a larger number of S-pole and N-pole magnetized portions.

Next, a description will be given in detail of a second application example of the magnetic sensor of the present invention with reference to FIG. 11.

Figure 11:
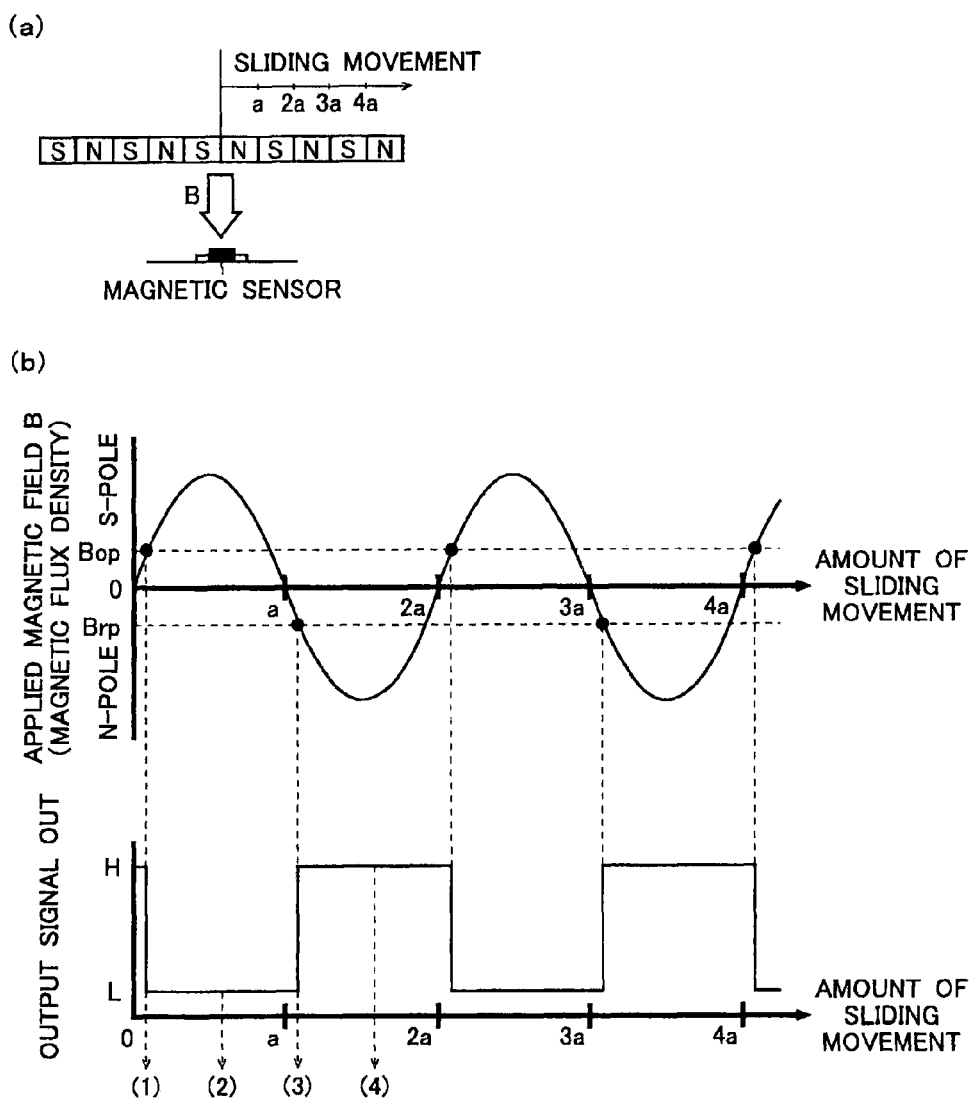
FIG. 11 is a set of diagrams showing a second example of the application of the magnetic sensor circuit of the present invention.

FIG. 11 is a set of diagrams showing a second application example of the magnetic sensor circuit of the present invention (application thereof in detection of sliding movement). FIG. 11(a) is a diagram conceptually showing the application of the magnetic sensor circuit of the present invention in detection of sliding movement, and FIG. 11(b) is a timing chart for showing a relationship between the applied magnetic field B (magnetic flux density) and the output signal OUT with respect to the amount of sliding movement. (1) to (4) in FIG. 11(b) correspond to (1) to (4) in FIG. 8, which has already been referred to.

As shown in FIG. 11(a), a target whose sliding movement is to be detected is provided with a magnet having a plurality of S-pole and N-pole magnetized portions, and is so formed as to apply an alternating magnetic field to the magnetic sensor circuit as it slidingly moves.

Thus, as shown in FIG. 11(b), the output signal OUT of the magnetic sensor circuit varies in a pulse-like manner as the target slides, the number of pulses in the output signal OUT is commensurate with the amount of sliding movement (the number of switching between the S pole and the N pole). Hence, by counting the number of pulses in the output signal OUT using an analysis circuit, a slide position to which the target has slid (the amount of sliding movement) can be detected.

Accuracy of detection of the target slide position can be improved by dividing the magnet into a larger number of S-pole and N-pole magnetized portions.

Also, a magnet may be fixed and the magnetic sensor circuit may be mounted on a target that is made to slidingly move.

Next, a description will be given in detail of a third application example of the magnetic sensor circuit of the present invention with reference to FIG. 12.

Figure 12:
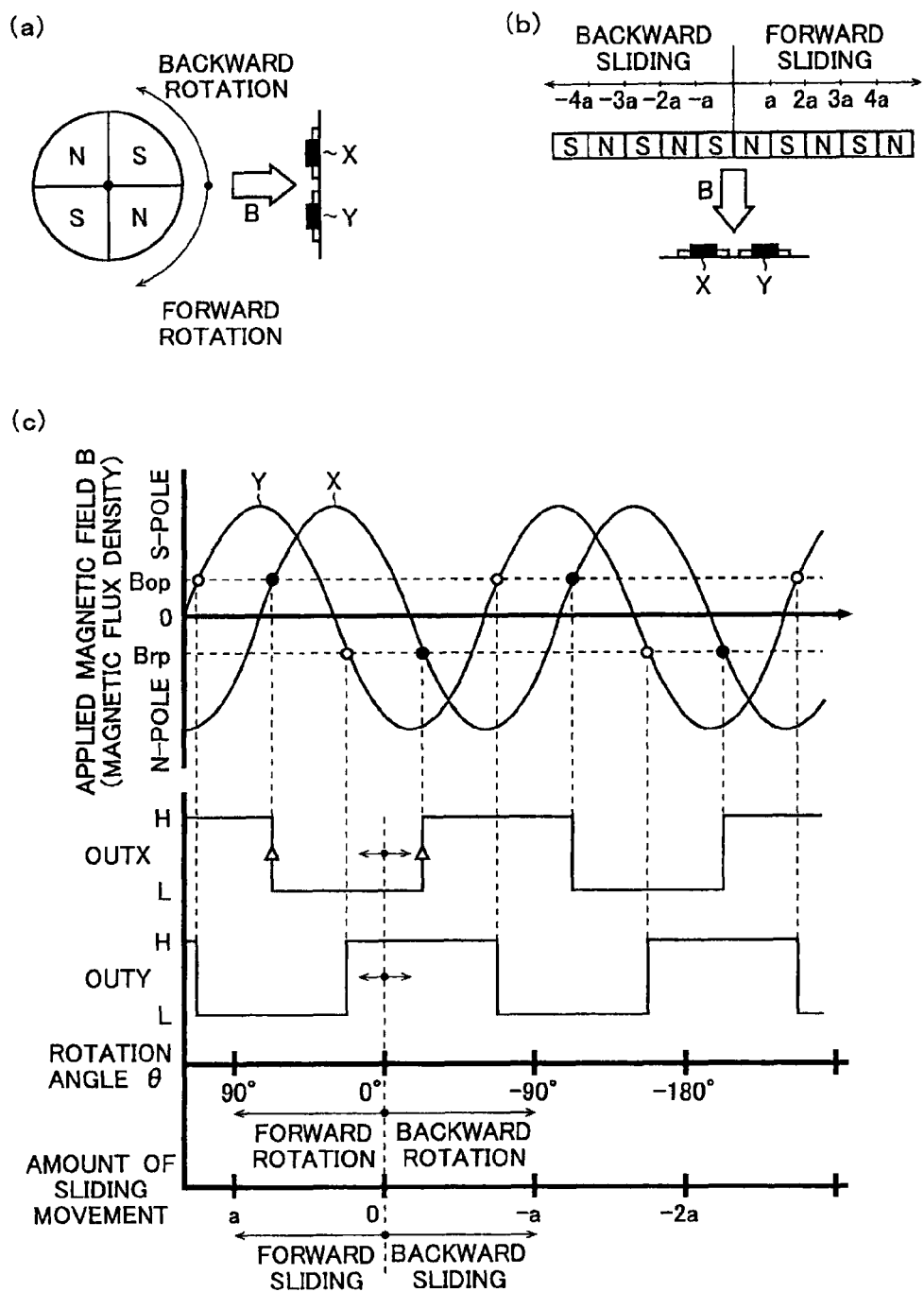
FIG. 12 is a set of diagrams showing a third example of the application of the magnetic sensor circuit of the present invention.

FIG. 12 is a set of diagrams showing the third application example of the magnetic sensor circuit of the present invention (application thereof in rotation detection or sliding movement detection). FIG. 12(a) is a diagram conceptually showing the application of the magnetic sensor circuit of the present invention in rotation detection, and FIG. 12(b) is a diagram conceptually showing the application of the magnetic sensor circuit of the present invention in sliding movement detection. FIG. 12(c) is a timing chart for showing the relationship between the applied magnetic field B (magnetic flux density) and output signals OUTX and OUTY with respect to a rotation angle θ and the amount of sliding movement.

As shown in FIG. 12(a), a target whose rotation is to be detected is provided with a magnet having a plurality of S-pole and N-pole magnetized portions, and is so formed as to apply an alternating magnetic field to the magnetic sensor circuit X and the magnetic sensor circuit Y as it rotates. The magnetic sensor circuits X and Y may be placed at a side-face side of the target (magnet) or may be placed at the top-face side or the bottom-face side of the target (magnet).

Also, as shown in FIG. 12(b), a target whose sliding movement is to be detected is provided with a magnet having a plurality of S-pole and N-pole magnetized portions, and is so formed as to apply an alternating magnetic field to the magnetic sensor circuits X and Y as it slides.

Both in FIGS. 12(a) and 12(b), the magnetic sensor circuit X is disposed at a position on an upstream side along a forward rotation direction (that is, a side at which the polarity of the magnetic field changes first when the target is rotated (or slid) forward), and the magnetic sensor circuit Y is disposed at a position on a downstream side.

Thus, as shown in FIG. 12 (c), the output signal OUTX of the magnetic sensor circuit X and the output signal OUTY of the magnetic sensor circuit Y each vary in a pulse-like manner as the target rotates or slides. Here, using an analysis circuit, at a timing when an output signal OUTA of the magnetic sensor circuit X rises to high level, the target can be judged to be being rotated (or slid) forward when an output signal OUTB of the magnetic sensor circuit Y remains low level (i.e., the magnetic sensor circuit Y has not detected an N-pole signal yet), while the target can be judged to be being rotated (or slid) backward when the output signal OUTB of the magnetic sensor circuit Y is already high level (i.e., the magnetic sensor circuit Y has already detected an N-pole signal).

Detection of the rotation angle, the rotation frequency, or the slide position of the target can be achieved, as already mentioned, by counting the number of pulses in the output signal OUTX or OUTY using an analysis circuit.

Accurate of the detection of the rotation angle or the slide position of the target can be improved by dividing the magnet into more regions.

Figure 13:
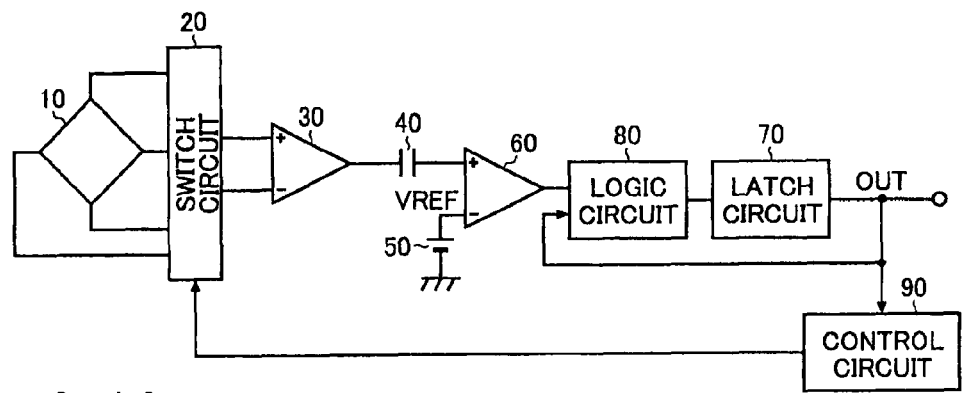
FIG. 13 is a diagram showing a modified example of the magnetic sensor circuit of the present invention.
Figure 14:
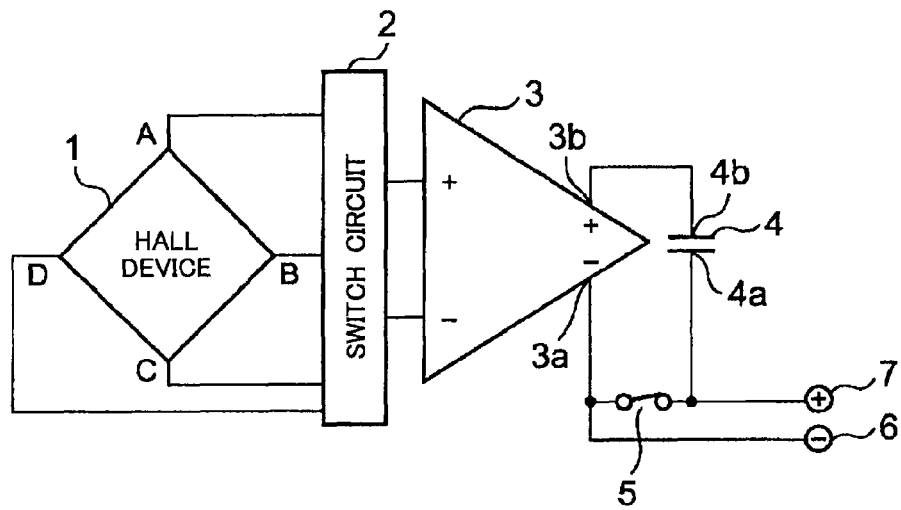
FIG. 14 is a diagram showing the configuration of a conventional magnetic field sensor.
Figure 15:
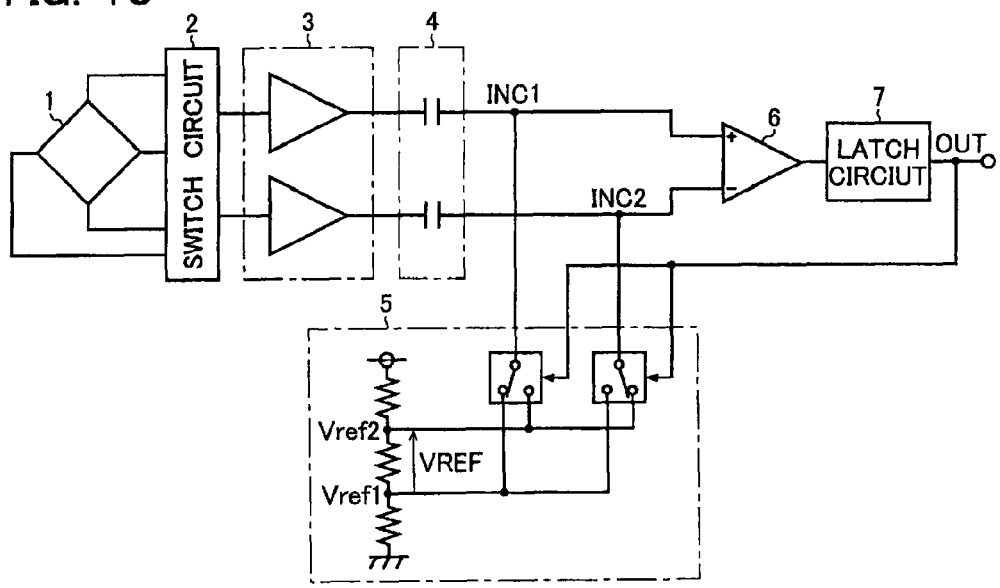
FIG. 15 is a diagram showing a conventional example of an alternating magnetic field detection type magnetic sensor circuit.
Figure 16:
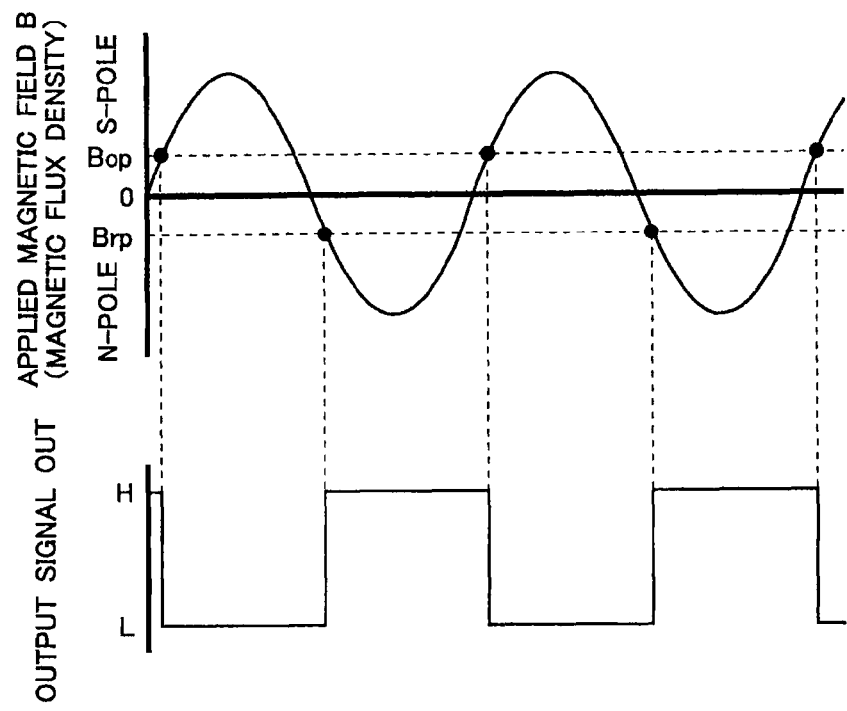
FIG. 16 is a diagram showing the effect of a comparator offset voltage.
Figure 16:
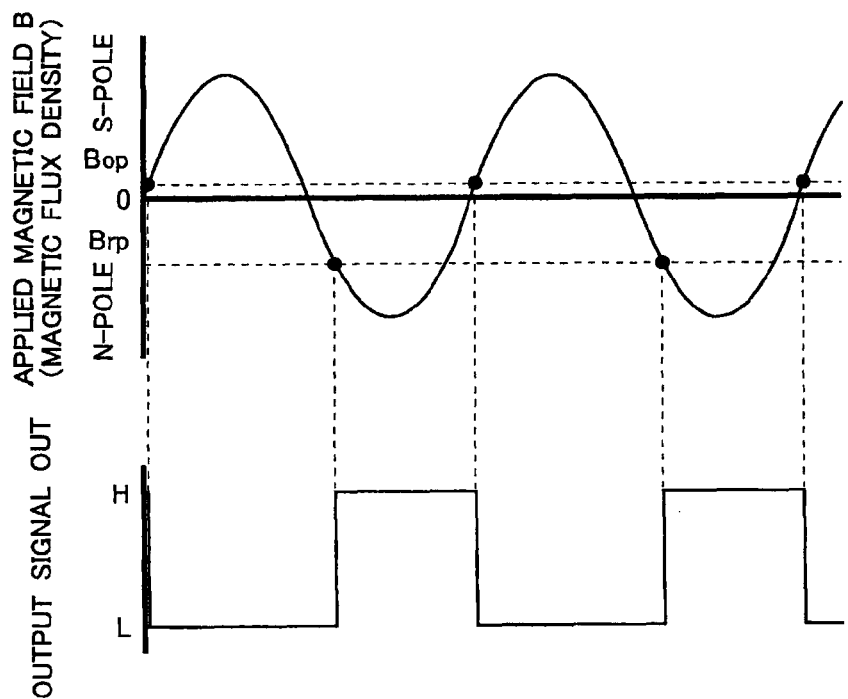

The embodiments described above deal with cases where the amplifier unit 30 is of two-input two-output type for the purpose of canceling out the device offset voltages of the Hall device 10 and the input offset voltages of the amplifier unit 30, and the comparison at the comparator unit 60 is performed based on the first and second amplified voltages AOUT1 and AOUT2; however, this is not meant to limit the configuration of the present invention, and for example, as shown in FIG. 13, the present invention is widely applicable to configurations where the amplifier unit 30 is of two-input one-output type.

Also, the present invention may be applied to a configuration resulting from removing the amplifier unit 30 from the configuration of FIG. 1.

In addition to the above embodiment, various modifications may be made to the configuration of the present invention without departing from the spirit thereof.

INDUSTRIAL APPLICABILITY

The present invention is suitably applicable to an alternating magnetic field detection type magnetic sensor circuit and electronic apparatuses incorporating this (e.g., rotation detecting devices and brushless motor driver ICs provided with a rotation detecting function).

The invention claimed is:

1. A device comprising at least one magnetic sensor circuit generating an output signal representing a logic level corresponding to a polarity of a detected magnetic field, the at least one magnetic sensor circuit comprising:
   a magnetoelectric conversion device generating, between a first pair of terminals or between a second pair of terminals, an output voltage commensurate with magnetism applied thereto;
   a selection switch circuit switched between a first switch state, in which a power supply voltage is applied between the first pair of terminals and a voltage appearing at one of the second pair of terminals is outputted to a first output terminal and a voltage appearing at the other of the second pair of terminals is outputted to a second output terminal, and a second switch state, in which the power supply voltage is applied between the second pair of terminals and a voltage appearing at one of the first pair of terminals is outputted to the first output terminal and a voltage appearing at the other of the first pair of terminals is outputted to the second output terminal;

a comparator unit performing comparison between a first comparison voltage and a second comparison voltage to generate a comparison result signal corresponding to a result of the comparison, the first comparison voltage being based on a voltage at the first output terminal and a predetermined first reference voltage, and the second comparison voltage being based on a voltage at the second output terminal and a predetermined second reference voltage;

a logic circuit generating, based on the output signal and the comparison result signal, a logic operation signal for maintaining or inverting a logic of the output signal;

a latch circuit latching the logic operation signal to output a latched logic operation signal as the output signal; and a control circuit determining, based on the output signal, whether switching control of the selection switch circuit is to be performed in an order from the first switch state to the second switch state or in an order from the second switch state to the first switch state.

2. A device comprising at least one magnetic sensor circuit generating an output signal representing a logic level corresponding to a polarity of a detected magnetic field, the at least one magnetic sensor circuit comprising:

a magnetoelectric conversion device generating, between a first pair of terminals or between a second pair of terminals, an output voltage commensurate with magnetism applied thereto;

a selection switch circuit switched between a first switch state in which a power supply voltage is applied between the first pair of terminals and a voltage appealing at one of the second pair of terminals is outputted to a first output terminal and a voltage appearing at the other of the second pair of terminals is outputted to a second output terminal, and a second switch state, in which the power supply voltage is applied between the second pair of terminals and a voltage appearing at one of the first pair of terminals is outputted to the first output terminal and a voltage appearing at the other of the first pair of terminals is outputted to the second output terminal;

an amplifier unit not only generating a first amplified voltage by amplifying a voltage applied from the first output terminal to output the first amplified voltage from a first amplification output terminal but also generating a second amplified voltage by amplifying a voltage applied from the second output terminal to output the second amplified voltage from a second amplification output terminal;

a comparator unit performing comparison between a first comparison voltage fed to a first comparison input terminal and a second comparison voltage fed to a second comparison input terminal to generate a comparison result signal corresponding to a result of the comparison, wherein the first comparison voltage is based on the first amplified voltage and a first reference voltage, and wherein the second comparison voltage is based on the second amplified voltage and a second reference voltage;

a first capacitor provided between the first amplification output terminal and the first comparison input terminal;

a second capacitor provided between the second amplification output terminal and the second comparison input terminal;

a first switch circuit for applying the first reference voltage to the first comparison input terminal when the selection switch circuit is in the first switch state;

a second switch circuit for applying the second reference voltage to the second comparison input terminal when the selection switch circuit is in the first switch state;

a logic circuit generating a logic operation signal for maintaining or inverting a logic level represented by the output signal based on the output signal and the comparison result signal;

a latch circuit latching the logic operation signal to output, as the output signal, the logic operation signal thus latched; and a control circuit determining, based on the output signal, whether switching control of the selection switch circuit is to be performed in an order from the first switch state to the second switch state or in an order from the second switch state to the first switch state.

3. The device of claim 2, wherein the at least one magnetic sensor circuit further comprises:

a first power switch provided in a power supply path to the amplifier unit; and a second power switch provided in a power supply path to the comparator unit, and wherein the control circuit intermittently supplies power to at least one of the amplifier unit and the comparator unit.

4. An electronic apparatus, comprising:

a target;

the device of any one of claims 1 to 3; and an analysis circuit analyzing movement of the target according to the output signal of the at least one magnetic sensor circuit, wherein the target is provided with a magnet having a plurality of S-pole magnetized portions and a plurality of N-pole magnetized portions, and applies an alternating magnetic field to the at least one magnetic sensor circuit as the target moves.

5. The electronic apparatus of claim 4, wherein the analysis circuit detects a position or movement amount of the target by counting a number of pulses in the output signal obtained at the at least one magnetic sensor circuit.

6. The electronic apparatus of claim 4, wherein the at least one magnetic sensor circuit includes a plurality of magnetic sensor circuits disposed along a direction in which the target moves, and wherein the analysis circuit monitors output signals obtained at the plurality of magnetic sensor circuits, and detects a direction in which the target is moving, at a timing when a logic level represented by an output signal of one of the plurality of magnetic sensor circuits changes from a first logic level to a second logic level, based on whether a logic level represented by another output signal of another one of the plurality of magnetic sensor circuits is the first logic level or the second logic level.

7. The electronic apparatus of claim 5,
wherein the at least one magnetic sensor circuit includes a plurality of magnetic sensor circuits disposed along a direction in which the target moves, and
wherein the analysis circuit monitors output signals obtained at the plurality of magnetic sensor circuits, and detects a direction in which the target is moving, at a timing when a logic level represented by an output signal of one of the plurality of magnetic sensor circuits changes from a first logic level to a second logic level, based on whether a logic level represented by another output signal of another one of the plurality of magnetic sensor circuits is the first logic level or the second logic level.

* * * * *